(12) United States Patent
Penjovic et al.

(10) Patent No.: US 9,885,749 B2
(45) Date of Patent: Feb. 6, 2018

(54) PROBE-PAD QUALIFICATION

(71) Applicant: Infineon Technologies AG, Neubiberg (DE)

(72) Inventors: Ivan Penjovic, Munich (DE); Josef Martin Paul Hennig, Riemerling (DE); Oliver Nagler, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/176,186

(22) Filed: Jun. 8, 2016

(65) Prior Publication Data
US 2016/0356844 A1    Dec. 8, 2016

(30) Foreign Application Priority Data

Jun. 8, 2015   (DE) .................. 10 2015 109 008

(51) Int. Cl.
*G01R 1/06* (2006.01)
*G01R 31/28* (2006.01)
(Continued)

(52) U.S. Cl.
CPC ........ G01R 31/2891 (2013.01); G01L 5/0028 (2013.01); G01R 1/067 (2013.01);
(Continued)

(58) Field of Classification Search
CPC ............ G01R 31/2891; G01R 31/2887; G01R 31/2889; G01R 31/26; G01R 31/2642;
(Continued)

(56) References Cited

U.S. PATENT DOCUMENTS 6,720,789 B1    4/2004  Audette et al.
6,927,585 B2 *  8/2005  Gleason .............. G01R 1/06711
                                                     324/754.2
(Continued)

OTHER PUBLICATIONS

Roucou, Romuald. "Analyse expérimentale et numérique des défaillances mécaniques locales induites dans les interconnexions par les tests paramétriques et les assemblages : Optimisation des procédés et des architectures des plots de connexion". Thesis. Dec. 9, 2010 <https://tel.archives-ouvertes.fr/tel-00669635/>.*
(Continued)

*Primary Examiner* — Jonathan Dunlap
(74) *Attorney, Agent, or Firm* — Viering, Jentschura & Partner mbB

(57) ABSTRACT

A method in accordance with various embodiments may include: measuring a contact force between at least one probe and at least one contact pad for a plurality of probe overdrive positions, and determining a relationship between contact force and probe overdrive position from the measured contact forces; determining a first region in the relationship exhibiting a non-linear dependence of the contact force from the probe overdrive position, and a second region exhibiting a linear dependence of the contact force from the probe overdrive position; and determining a process window for a pad probing process based on the determined first region and second region.

23 Claims, 12 Drawing Sheets

(51) Int. Cl.
 G01R 1/067 (2006.01)
 G01L 5/00 (2006.01)
 *H05K 1/02* (2006.01)
 *G01R 31/26* (2014.01)
(52) U.S. Cl.
 CPC .............. *G01L 5/0038* (2013.01); *G01R 1/06* (2013.01); *G01R 1/06711* (2013.01); *G01R 1/06716* (2013.01); *G01R 1/06794* (2013.01); *G01R 31/26* (2013.01); *G01R 31/2642* (2013.01); *G01R 31/2887* (2013.01); *G01R 31/2889* (2013.01); *H05K 1/0268* (2013.01)
(58) Field of Classification Search
 CPC ...... G01R 1/067; G01R 1/06794; G01R 1/06; G01R 1/06711; G01R 1/06716; G01L 5/0038; G01L 5/0028; H05K 1/0268
 USPC ............ 324/750.25, 750.01, 750.24, 754.03, 324/762.03, 762.01, 754.07, 754.08, 324/754.19, 754.2; 29/593
 See application file for complete search history.

(56) References Cited

U.S. PATENT DOCUMENTS

| | | | | |
|---|---|---|---|---|
| 8,013,621 B2* | 9/2011 | Sano | ................... | G01R 31/2891 324/750.16 |
| 2002/0080041 A1* | 6/2002 | Ohno | ................ | G01R 31/2887 340/679 |
| 2006/0273780 A1 | 12/2006 | Stillman et al. | | |
| 2008/0100312 A1* | 5/2008 | Breinlinger | ........ | G01R 31/2891 324/756.03 |
| 2008/0290885 A1* | 11/2008 | Matsunami | ........ | G01R 31/2889 324/762.01 |
| 2012/0032697 A1* | 2/2012 | Khoo | ................. | G01R 1/06727 324/755.07 |
| 2012/0123734 A1* | 5/2012 | Linde | ................. | G01R 31/2891 702/150 |
| 2016/0216321 A1* | 7/2016 | Edwards | ............ | G01R 31/2891 |

OTHER PUBLICATIONS

Shin et al. "Fatigue Life Estimation of Vertical Probe Needle for Wafer Probing". International Journal of Precision Engineering and Manufacturing, vol. 16, No. 12, pp. 2509-2515. Nov. 2015. <http://download.springer.com/static/pdf/274/art%253A10.1007%252Fs12541-015-0322-8.pdf>.*

Liu et al. "Probe Test Failure Analysis of Bond Pad Over Active Structure by Modeling and Experiment". Electronic Components and Technology Conference. 2005. pp. 861-866. <http://ieeexplore.ieee.org/document/1441373/>.*

Nagler: "Probing-induzierte Defekte bei Halbleitern mit Kontaktpads über aktiven Strukturen", PhD thesis, Mar. 2009, 137 pages, Munich, Germany, with page of English abstract.

Ferron: "Optimierung der Qualifikationsmethode beim Probing-over-Active-Area (PoAA) durch statistische Versuchsplanung", master's thesis, Jul. 2011, 72 pages, Munich, Germany, with English abstract.

* cited by examiner

FIG. 14

PROBE-PAD QUALIFICATION

CROSS-REFERENCE TO RELATED APPLICATION

This application claims priority to German Patent Application Serial No. 10 2015 109 008.2, which was filed Jun. 8, 2015, and is incorporated herein by reference in its entirety.

TECHNICAL FIELD

Various embodiments relate generally to wafer probing, and more particularly to probe force investigation used for automated probe-pad qualification.

BACKGROUND

Integrated circuits (also referred to as dies or chips) are typically tested on wafer level subsequent to manufacturing (so-called "wafer probing" or, short, "probing"). During the testing, a final application environment may be simulated electrically. To this end, dies on a wafer may be mechanically and electrically contacted with one or more probes (e.g., a probe card including a plurality of probes) to send in and read out electrical signals via the probes. The probes may be configured as needles, e.g., cantilever needles, which may contact one or more contact pads (also referred to as bonding pads or, short, pads) of the dies.

Recent chip manufacturing technologies tend to place the contact pads over active areas of the chips in order to save chip area (sometimes referred to as PoAA (Pad Over Active Area) configuration or design). Probes (e.g., needles) contacting the pads during wafer probing exert mechanical forces (contact forces) on the pads, which may cause damage to the pads and/or layers below the pads. For example, cracks may occur in an insulating layer (e.g., oxide layer) below a pad, which in turn may cause short circuits between the pad and an electrically conductive line below the pad.

Conventional methods for detecting damages caused by probing require, for example, a) measurement of pad penetration depths (scrub depths) by means of confocal microscopy, or b) chemical preparation of tested dies and subsequent optical inspection/control with respect to damages in the insulating layer (e.g., oxide) below the pads. Both methods may need to be carried out manually (which may require considerable effort, may be expensive and unreliable), and the results may often be open to interpretation. Investigations by means of chemical preparation may commonly require several days up to weeks, or may not be possible for some products.

Due to the relatively high effort involved in the aforementioned conventional methods, process windows may oftentimes only be determined with a relatively low number of parameter variations. This may result in an over dimensioning (e.g., with respect to pad geometry, pad material, expensive needle technology) in order to guarantee the necessary reliability. Furthermore, an optimum solution may not be found systematically.

SUMMARY

A method in accordance with various embodiments may include: measuring a contact force between at least one probe and at least one contact pad for a plurality of probe overdrive positions, and determining a relationship between contact force and probe overdrive position from the measured contact forces; determining a first region in the relationship exhibiting a non-linear dependence of the contact force from the probe overdrive position, and a second region exhibiting a linear dependence of the contact force from the probe overdrive position; and determining a process window for a pad probing process based on the determined first region and second region.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 14 shows a table corresponding to an exemplary measurement setup for illustrating one or more aspects of various embodiments;

DESCRIPTION

Figure 1:
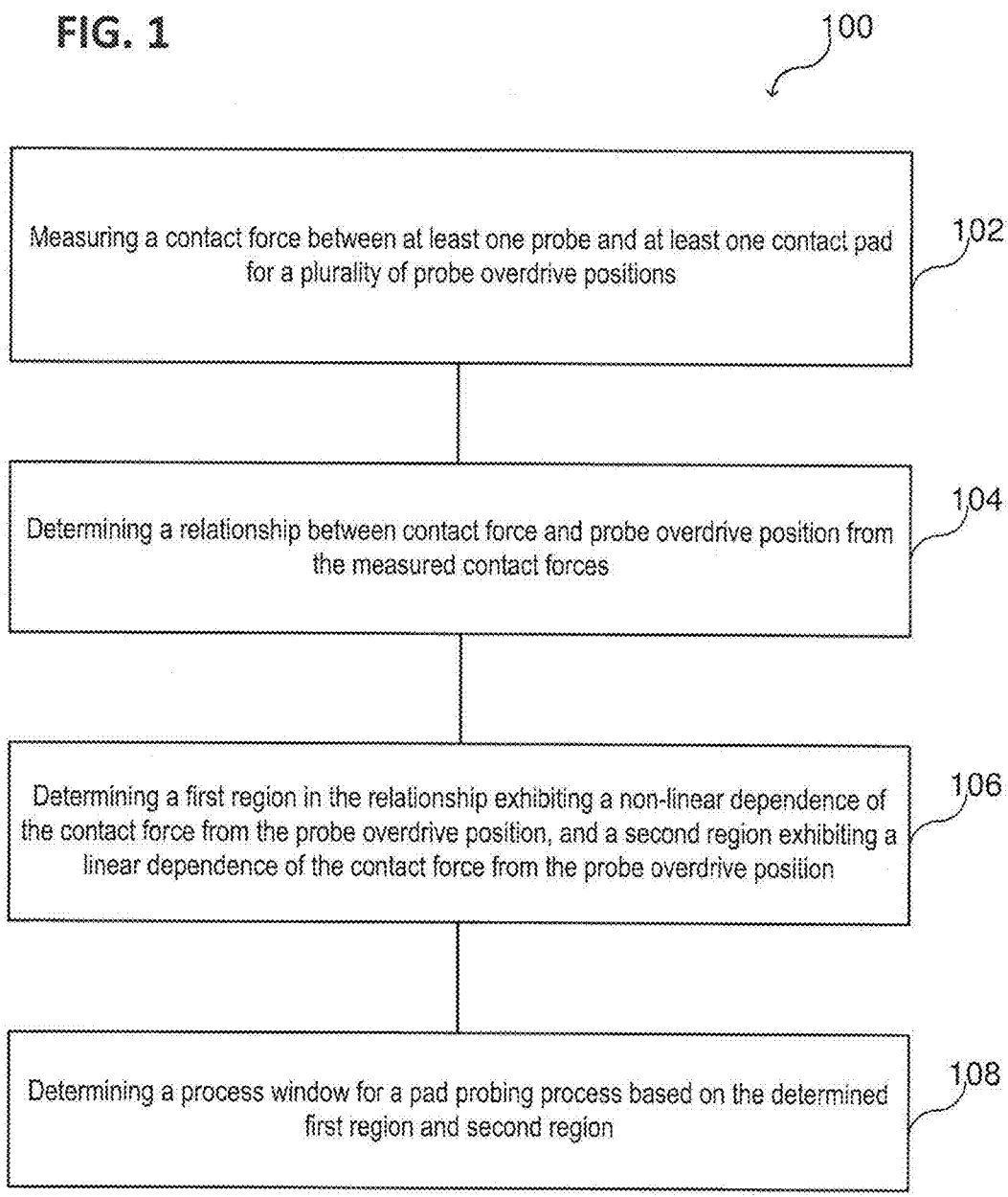
FIG. 1 shows a method in accordance with various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide methods and/or devices that may be used to improve wafer probing in terms of reliability.

Various embodiments provide methods and/or devices that may be used to prevent or reduce damage to integrated circuit (IC) structures that may be caused by contacting pads with probes (e.g., probing needles, e.g. cantilever needles) during a wafer test.

Various embodiments provide an automated qualification method for wafer probing. In one or more embodiments, a process window for reliable pad probing may be determined by means of force measurements measuring a contact force between a probe (e.g., cantilever needle probe) and a pad for a plurality of probe overdrives, and analyzing the measured contact force behavior.

The force measurement of a single contacting process with a probing needle may be mainly determined by elastic properties of the needle and may furthermore be influenced by contamination effects through pad residues. The change of the force-overdrive behavior (dependence of force on the probe overdrive, in other words on the amount of travel of the probe after initial touchdown of the probe, e.g. needle tip) during plastic deformation of the pad may be relatively small compared to the force-overdrive characteristics of the needle but may be visible (detectable) using statistical analysis.

In one or more embodiments, the measurements may be carried out in a randomized way in order to minimize the effect of a continuous contamination of the probe (e.g., needle) (i.e., contamination of the probe (e.g., needle) with pad material, e.g. aluminum in case of an aluminum pad). In this context, "randomized" may, for example, include the case that contact pad/overdrive pairings may be chosen randomly. For example, contact forces for different probe overdrive positions of the same probe may be measured at different contact pads in a randomized sequence. For example, the contact force for a first probe overdrive position ($z_1$) may be measured at a first contact pad (or at a plurality of first contact pads, e.g. contact pads in a first row or column of a grid arrangement of pads), the contact force for a second probe overdrive position ($z_2$) may be measured at a second contact pad (or at a plurality of second contact pads, e.g. contact pads in a second row or column of the grid arrangement), the contact force for a third probe overdrive position ($z_3$) may be measured at a third contact pad (or at a plurality of third contact pads, e.g. contact pads in a third row or column of the grid arrangement), etc. In one or more embodiments, the first probe overdrive position ($z_1$), second probe overdrive position ($z_2$), third probe overdrive position ($z_3$), etc., may be chosen randomly between a minimum probe overdrive position ($z_{min}$) and a maximum probe overdrive position ($z_{max}$). In other words, the probe overdrive positions $z_1$, $z_2$, $z_3$, . . . may form a random sequence of positions, not an ordered sequence of positions, in accordance with some embodiments.

As used herein, the term "probe overdrive" or, short, "overdrive" may, for example, refer to the amount of travel (vertical movement) of the probe (or at least a portion of the probe) after initial touchdown of the probe on the pad. For example, in case of a cantilever needle probe, "probe overdrive" may refer to the amount of travel (vertical movement) of the cantilever base after initial touchdown of the needle tip on the pad. In this context, "vertical movement" may refer to a movement along an axis that is perpendicular, or at least substantially perpendicular, to the pad surface (so-called "vertical axis"). Initial touchdown of the probe may, for example, correspond to an "overdrive" or "overdrive position" of "0" (zero). Moving the probe (e.g., cantilever base) from this initial touchdown position of "0" further towards the pad may result in positive values of the overdrive (positive overdrive positions), e.g. +z μm, where "z" may be a positive real number. Typical probe overdrives or overdrive positions may range from 0 up to a few tens of microns, or a few hundreds of microns, however other values may be possible.

As used herein, the term "probe contact force" or, short, "contact force" may refer to a mechanical force exerted by the probe (e.g., the probe tip, e.g. needle tip) on the contact area of a pad at non-zero overdrive. Typical contact forces between probes and pads may, for example, range from 0 up to a few hundreds of mN depending on probe overdrive. Specific values of the contact forces between probes and pads may slightly vary depending on a number of parameters such as shape or material of the probe, which may influence the probe's spring characteristics (and thus the contact force), and/or shape or material of the pad. For example, probes containing an alloy of tungsten (W) and rhenium (Re) may exhibit a quantitatively different probe-force behavior than probes containing an alloy of copper (Cu) and beryllium (Be) (or probes made of still other material(s)), and cantilever probes having a smaller tip diameter may exhibit a quantitatively different probe-force behavior than cantilever probes having a larger tip diameter. However, for each probe-pad combination the probe contact force generally increases with increasing probe overdrive at least within a certain range of overdrives. In other words, the qualitative probe-force behavior may be independent of the probes and/or pads. In accordance with various embodiments, this qualitative probe-force behavior may be analyzed, and it may be deduced from the probe-force behavior whether a probe movement is purely elastic or is an elastic-plastic movement.

Various embodiments provide methods and/or devices that may be used to determine a process window for reliable wafer probing. In accordance with various embodiments, a process window may be determined for various combinations of probe and pad, e.g. for a tungsten (W) cantilever probe used to contact a copper (Cu) pad, to name just one possible example. In one or more embodiments, the process window may define, for a given number of probe touchdowns, a range of probe overdrives, in which the probe may "safely" operate, e.g. without running the risk to pierce through the pad and/or induce cracks in a layer below the pad. In one or more embodiments, the process window may define, for a given value of the probe overdrive, a maximum number of probe touchdowns that may "safely" be carried out at the same pad, e.g., again, without running the risk to pierce through the pad and/or induce cracks in a layer below the pad.

In accordance with various embodiments, a residual thickness of a contact pad may be deduced through analysis of force measurements during a probing process. The statistical effort may be relatively high. However, the method may be carried out in an automated way within several hours in order to obtain a complete process window with parameters for reliable probing. Subsequent optical inspection and expert evaluation may not be required.

In accordance with various embodiments, a differentiation between elastic-plastic deformation and purely elastic deformation through force measurements during the probing process allows for conclusions as to quality relevant damages. In case the analysis of a force measurement does not show any signs of plastic deformation of a pad, the contacting probe (e.g., needle) may have already fully pierced through the pad. This represents a quality problem, which may be difficult and/or require high effort to prove reliably using conventional methods such as optical inspection by confocal microscopy.

Methods in accordance with various embodiments may serve for qualification of a needle-pad pairing before a productivity test. The characterization may be carried out automatically in dependence on movement path (overdrive) and number of contactings (number of touchdowns) with a single needle (probe) card. As a result, a process window for reliable probing (with existing pad residual thickness) may be provided, in which tolerances for a probe card (with several needles) may additionally be included in accordance with some embodiments. Alternatively, the characterization may also be carried out using a probe card with a plurality of probes (e.g., needles).

In accordance with various embodiments, needle-pad pairings may be varied, for example in terms of needle and/or pad materials. Methods in accordance with various embodiments may be applied for qualification in a productivity test. In accordance with various embodiments, the qualification may be carried out in a productivity prober. For example, a calibration wafer may be inserted before the start of an actual wafer test by integration of a force measurement chuck in a probing apparatus ("prober") in order to determine a reliable process window for the applied probe card-pad pairing (combination of probe card and pad). Probing apparatuses (probers) with force measurement functionality already exist. Thus, in accordance with various embodiments, the method may be implemented in such probing apparatuses (probers) by means of software (e.g., software upgrade). In other words, various embodiments may be used with existing hardware, e.g. via prober software upgrade.

FIG. 1 shows a method 100 in accordance with various embodiments.

In 102, a contact force between at least one probe and at least one contact pad may be measured for a plurality of probe overdrive positions. In other words, the contact force may be measured for each probe overdrive position at least once, thus obtaining a plurality of measurement values. In one or more embodiments, the number of probe overdrive positions, for which the contact force may be measured, may, for example, be greater than or equal to 10, e.g. greater than or equal to 20, e.g. greater than or equal to 50, e.g. greater than or equal to 100, or even more. In one or more embodiments, the probe overdrive positions may range from a minimum probe overdrive position, e.g. 5 μm in one embodiment (however, other values may be possible as well), to a maximum probe overdrive position, e.g. 100 μm in one embodiment (however, other values may be possible as well).

In 104, a relationship between contact force and probe overdrive position may be determined from the measured contact forces. For example, the relationship may be represented as a graph or curve in a diagram.

In 106, a first region exhibiting a non-linear dependence of the contact force from the probe overdrive position, and a second region exhibiting a linear dependence of the contact force from the probe overdrive position may be determined in the relationship. In other words, the relationship between contact force and probe overdrive position (e.g., the graph or curve) may include a non-linear region or region of non-linear behavior (first region), and a linear region or region of linear behavior (second region). In still other words, in the first region the contact force may depend non-linearly on the probe overdrive, and in the second region the contact force may depend linearly on the probe overdrive.

In 108, a process window for a pad probing process may be determined based on the determined first region and second region. For example, the process window may define a parameter region or range of parameter values, which may be used for a pad probing process in order to avoid damage to one or more layers or structures located below the pad. For example, the parameter region may define a maximum probe overdrive position for a given number of probe-pad contactings (touchdowns), and/or a maximum number of probe-pad contactings (touchdowns) for a given probe overdrive position. Alternatively or in addition, method 100 may be further configured in accordance with one or more embodiments described herein.

Figure 2:
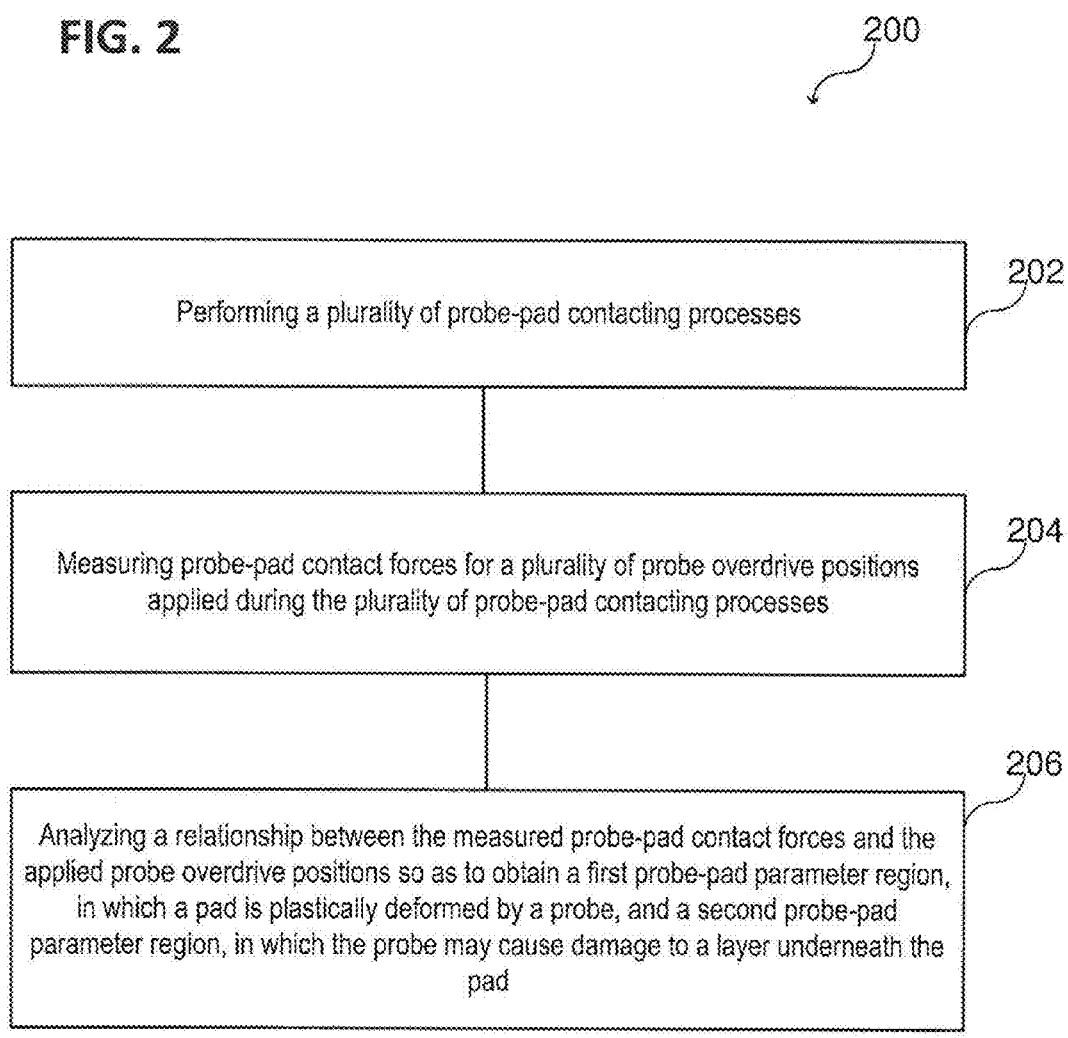
FIG. 2 shows a method for probe-force investigation in accordance with various embodiments.

FIG. 2 shows a method 200 for probe-force investigation in accordance with various embodiments.

In 202, a plurality of probe-pad contacting processes may be performed. For example, each probe-pad contacting process may include contacting a pad with a probe (in other words, bringing the probe in contact with the pad), for example contacting a needle tip (e.g., cantilever needle tip) with the pad, for example by moving the probe towards the pad and/or moving the pad towards the probe. For example, the pad may be part of a chip, the chip may be part of a wafer, the wafer may be disposed over (e.g., on) a wafer supporting structure, e.g. a wafer chuck, and the wafer supporting structure (e.g., chuck) with the wafer may be moved towards the probe. Alternatively or in addition, the probe (e.g., a single needle probe or a probe card including one or more needle probes) may be attached to a probe supporting structure, and the probe supporting structure with the probe may be moved towards the pad. In one or more embodiments, movement of the wafer supporting structure and/or of the probe supporting structure may be along a direction perpendicular, or at least substantially perpendicular, to a surface of the pad(s).

In 204, probe-pad contact forces may be measured for a plurality of probe overdrive positions applied during the plurality of probe-pad contacting processes. For example, after initial touchdown of a probe on a pad, a contact force between the probe and the pad may be measured for one or a plurality of different overdrive positions of the probe.

In 206, a relationship between the measured probe-pad contact forces and the applied probe overdrive positions may be analyzed so as to obtain a first probe-pad parameter region, in which a pad may be plastically deformed by a probe, and a second probe-pad parameter region, in which the probe may cause damage to a layer underneath the pad. Alternatively or in addition, method 200 may be configured in accordance with one or more embodiments described herein.

Figure 3:
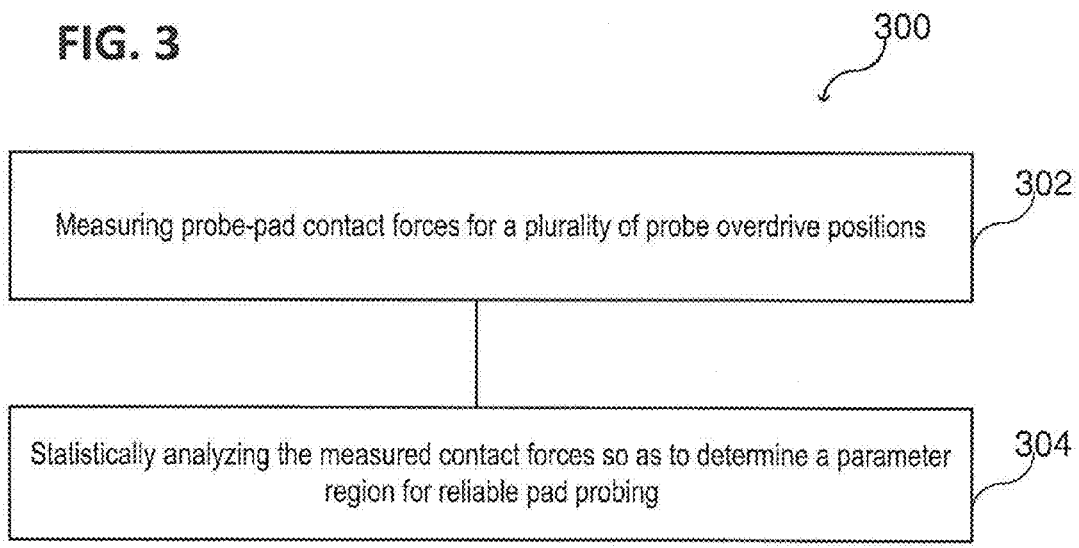
FIG. 3 shows a method for automated probe-pad qualification in accordance with various embodiments.

FIG. 3 shows a method 300 for automated probe-pad qualification in accordance with various embodiments.

In 302, probe-pad contact forces may be measured for a plurality of probe overdrive positions. The contact forces may, for example, be measured using a single needle probe (e.g., single cantilever needle probe) tool. The contact forces for the plurality of probe overdrive positions may, for example, be measured at a plurality of different contact pads. Alternatively, at least some of the contact forces may be measured at the same pad, for example at different areas of the pad. For example, in accordance with some embodiments, an entire side or surface of a semiconductor workpiece (e.g., wafer) may be coated with a metallization. In this case, the metallization coating the entire side of the workpiece (e.g., wafer) may be considered as a single pad. The term "contact pad" or "pad" as used throughout this application may therefore also include the aforementioned case that a workpiece (e.g., wafer) is covered all over with a metallization.

In 304, the measured probe-pad contact forces may be analyzed, e.g. statistically analyzed, so as to determine a parameter region for reliable pad probing. Statistically analyzing may, for example, include carrying out a curve fitting procedure to identify a region of linear dependence of the contact force on the probe overdrive position. Alternatively or in addition, analyzing the measured probe-pad contact forces may, for example, include determining a relationship $f(z)$ between probe-pad contact force and probe overdrive (z: probe overdrive; f: function), and determining the derivative ($f'=df/dz$), so as to identify the region of linear dependence of the contact force on the probe overdrive position. For example, the region of linear dependence may be reflected in a constant or substantially constant value of the derivative. Alternatively or in addition, method 300 may further be configured in accordance with one or more embodiments described herein.

Figure 4:
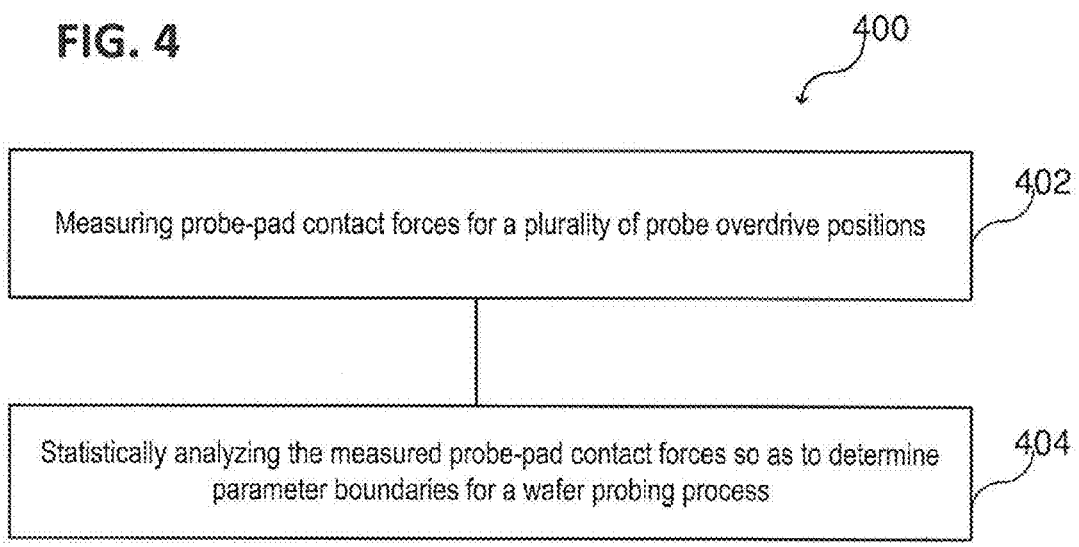
FIG. 4 shows an automated probe-pad qualification method for wafer probing in accordance with various embodiments.

FIG. 4 shows an automated qualification method 400 for wafer probing in accordance with various embodiments.

In 402, probe-pad contact forces may be measured for a plurality of probe overdrive positions.

In 404, the measured probe-pad contact forces may be statistically analyzed so as to determine parameter boundaries for a wafer probing process.

Alternatively or in addition, method 400 may further be configured in accordance with one or more embodiments described herein.

Figure 5:
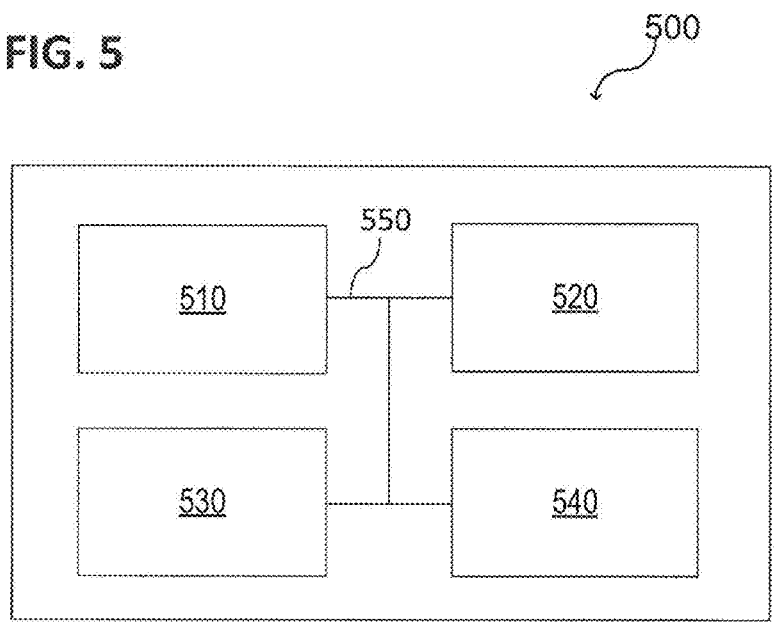
FIG. 5 shows a probing apparatus in accordance with various embodiments.

FIG. 5 shows a probing apparatus 500 in accordance with various embodiments.

The probing apparatus 500 may include a measuring device 510 for measuring a contact force between at least one probe and at least one contact pad for a plurality of probe overdrive positions.

The probing apparatus 500 may also include a determining device 520 for determining a relationship between contact force and probe overdrive position from the measured contact forces.

The probing apparatus 500 may also include a determining device 530 for determining a first region in the relationship exhibiting a non-linear dependence of the contact force from the probe overdrive position, and a second region exhibiting a linear dependence of the contact force from the probe overdrive position.

The probing apparatus 500 may also include a determining device 540 for determining a process window for a pad probing process based on the determined first region and second region.

In one or more embodiments, each of the devices 510 to 540 may be configured as an individual physical and/or logical entity (unit). In one or more embodiments, at least two of the devices 510 to 540 may be configured as and/or built into a common physical and/or logical entity (unit).

In one or more embodiments at least two of the devices 510 to 540 may be electrically and/or logically coupled to one another, as shown by coupling 550, for example to exchange information, data and/or signals.

In one or more embodiments, at least one of the determining devices 520 to 540 may be implemented as software, e.g. computing code that may be processed by a processor. For example, the probing apparatus 500 may include a memory configured to store the computing code, and a processor configured to carry out the computing code, wherein the computing code may include instructions for carrying out one or more (e.g., all) of the functionalities of the determining devices 520 to 540. For example, the probing apparatus 500 may be a prober equipped with probe-force measurement capability (corresponding to the measuring device 510), and the functionalities of at least one (e.g., all of) the determining devices 520 to 540 may be implemented as a software upgrade (e.g., firmware upgrade), which may, for example be loaded into the memory and/or processor of the prober. The software upgrade may, for example, be stored on a computer readable medium according to one or more embodiments.

In one or more embodiments, the probing apparatus 500 may include a handling device for mechanical handling of a semiconductor workpiece (e.g., a wafer including a plurality of chips, each chip including one or more contact pads, e.g. disposed over an active area of the chip), and a testing device for carrying out electrical testing (e.g., probing) at the workpiece (e.g., wafer), e.g. for simulating a final application environment. In one or more embodiments, the testing device may include at least one of the measuring device 510 and the determining devices 520 to 540.

Figure 6:
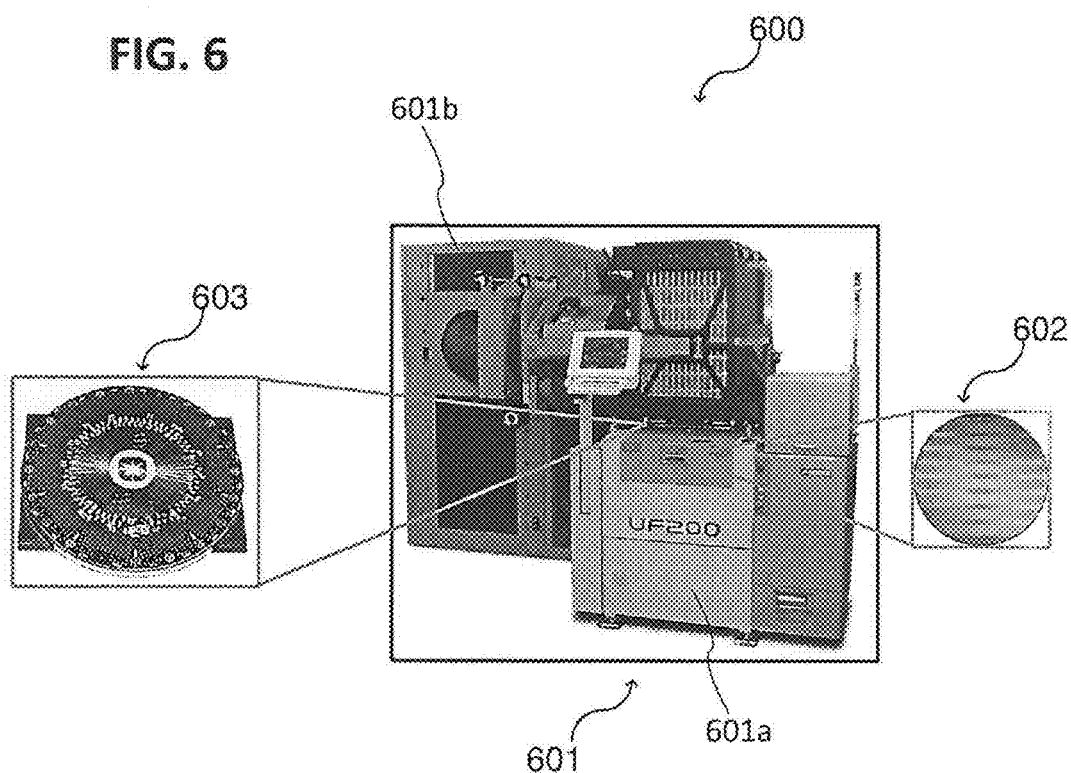
FIG. 6 shows a wafer testing environment for illustrating one or more aspects of various embodiments.

FIG. 6 shows a wafer testing arrangement 600 for illustrating one or more aspects of various embodiments.

The testing arrangement 600 may include a probing apparatus 601. The probing apparatus 601 may include a handling device 601a for mechanical handling of a semiconductor workpiece such as a wafer 602, as shown. The wafer 602 may include a plurality of chips. Each chip may include one or more contact pads. The probing apparatus 601 may further include a testing device (electrical test equipment or "tester") 601b for testing the chips on the wafer 602. To this end, the probing apparatus 601 may be provided with a probe card 603 including one or more probes, e.g. a plurality of cantilever needle probes. The probe card 603 may represent an interface between the chips and the testing device 601b in the test. The probe(s), e.g. needle(s), of the probe card 603 may be brought into contact with the pad(s) of the chips, for example by vertical and/or lateral movement of the wafer 602 and/or the probe card 603 relative to one another, and electrical signals may be sent in and/or read out from the chips via the probes, and may be analyzed by the testing device 601b.

Figure 7:
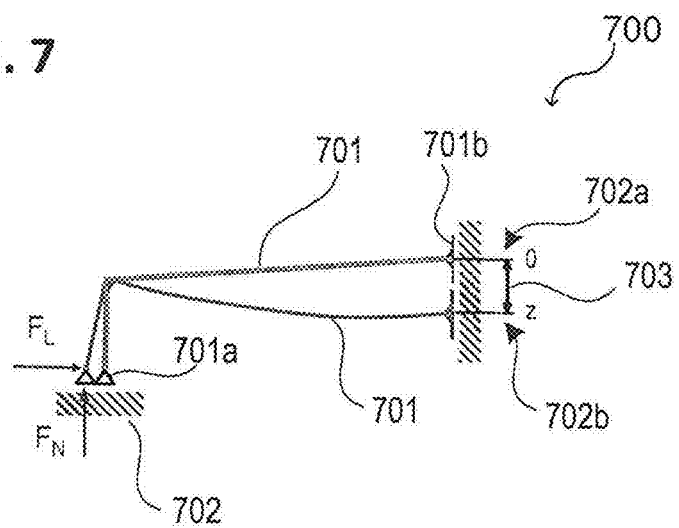
FIG. 7 shows a schematic view of a probe-pad contacting process for illustrating one or more aspects of various embodiments.

FIG. 7 shows a schematic view 700 of a probe-pad contacting process for illustrating one or more aspects of various embodiments.

FIG. 7 shows two positions 702a and 702b of a cantilever needle probe 701 during the probe-pad contacting. In a first position, 702a, a tip 701a of the probe 701 has just touched the surface of a pad 702 and does not exert force on the pad 702 (or exerts only a minimal or negligible force). Conversely, the pad 702 does not exert force on the probe 701 in this state. The first position 702a may correspond to a probe overdrive of "0" (zero) or initial touchdown position. In a second position, 702b, which may be attained by moving a base 701b of the probe 701 in vertical direction (a direction at least substantially perpendicular to the surface of the pad 702) further towards the pad 702 (and/or by moving the pad 702 in the opposite direction towards the probe 701), the probe 701 may be bent and the probe (or, the probe 701's tip 701a) may exert a force on the pad 702. Conversely, the pad 702 may exert a force of the same magnitude but opposite direction on the probe 701 according to Newton's third law of motion.

In the second position 702b, the probe 701's base 701b may be displaced vertically compared to its location in the first position 702a, and the probe 701's tip 701a may be displaced horizontally (in other words, laterally or parallel to the pad surface) compared to its location in the first position 702a. The contact force between probe 701 and pad 702 in the second position 702b may include a vertical component (normal component), $F_N$, and a horizontal component (lateral component), $F_L$, as shown. The horizontal component $F_L$ may be due to friction between probe tip 701a and pad 702 surface. The second position 702b may correspond to a non-zero probe overdrive. The probe overdrive may be given as the distance z between the two positions 702a and 702b of the probe 701's base 701b, as shown by arrow 703. The contact force between probe 701 and pad 702 generally increases with increasing probe overdrive z (at least within a certain range of overdrive positions).

Figure 8:
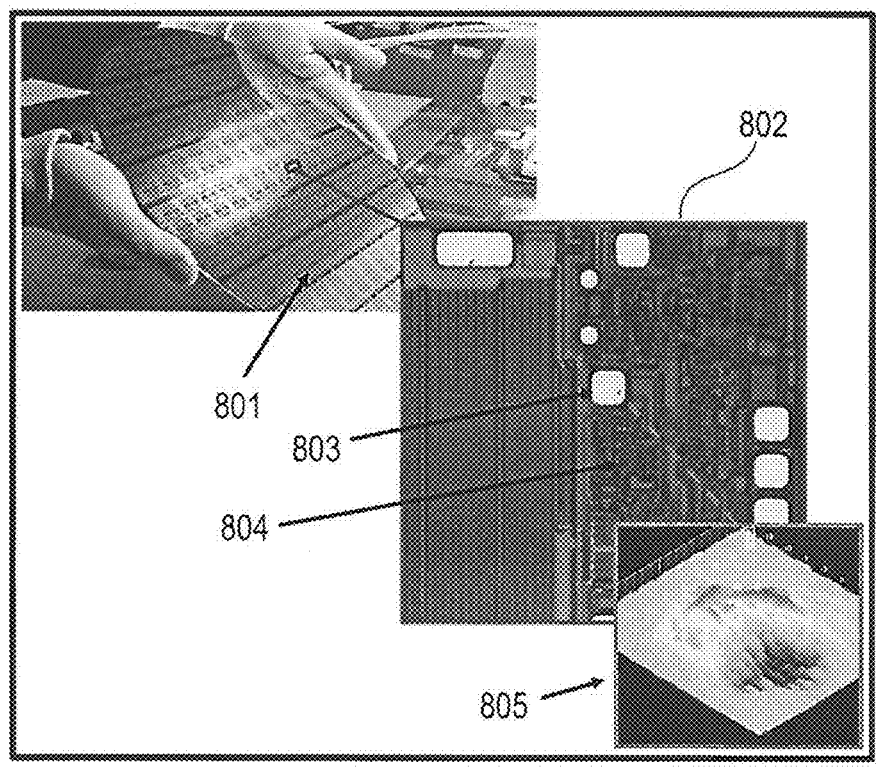
FIG. 8 shows views of a wafer surface after probing for illustrating one or more aspects of various embodiments.

FIG. 8 shows views of a wafer surface after probing for illustrating one or more aspects of various embodiments.

In particular, FIG. 8 shows a wafer 801 including a plurality of dies (chips) 802, each die 802 including a plurality of contact pads 803 and integrated circuit (IC) layers 804 below the pads 803. The pads 803 have been contacted in a wafer probing process by one or more probes (e.g., cantilever needle probes such as probe 701 shown in FIG. 7) for one or a plurality of times (i.e., one or a plurality of probe touchdowns).

As may be seen in an enlarged view 805 of a contact pad 803's surface obtained by analysis of confocal microscopy measurements, the pad surface has been deformed by the probe-pad contacting(s). That is, the contact pad 803's thickness may no longer be homogeneous. For example, portions of the contact pad 803 may have been thinned due to a probe (e.g., needle) scrubbing along the pad surface during the probing. It may even be possible, that the probe has pierced through the pad 803.

The aforementioned impacts on the pad 803 may cause critical damage to the pad itself and/or to IC layers 804 below, which may deteriorate reliability of the die 802. For example, cracks in an insulating layer below the pad 803 may cause short circuits in the die 802 due to conductive material (e.g., metal) of the pad 803 and/or of a conductive line below slowly wandering through the cracks. Various embodiments described herein may provide ways to avoid such critical damage in pad probing.

Figure 9:
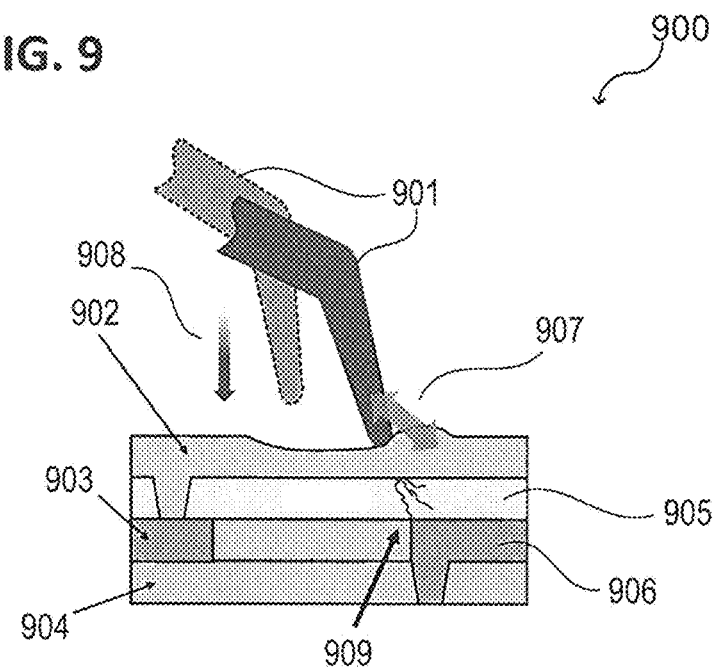
FIG. 9 shows a schematic view of a probe-pad contacting process for illustrating one or more aspects of various embodiments.

FIG. 9 shows a schematic view 900 of a probe-pad contacting process for illustrating one or more aspects of various embodiments.

As shown, a probe 901 may be moved towards a pad 902 disposed at the surface of a chip to contact the pad 902 (vertical probe movement illustrated by arrow 908). The pad 902 may, for example, be located over an active area of the chip to save chip area. The pad 902 may, for example, be a bonding pad made of metal or metal alloy such as aluminum (Al), copper (Cu), gold (Au), an alloy containing one or more of the aforementioned materials, e.g., AlCu, or the like. The probe 902 may, for example, be a cantilever needle probe, as shown, for example of a probe card including a plurality of cantilever needle probes. The pad 902 may be electrically connected to a metallization layer 903 in a metallization level below (e.g., copper or aluminum metallization). Another metallization layer 906 may be disposed in the same metallization level as metallization layer 903 and may be connected to another pad (not shown). The metallization layers 903 and 906 may be electrically insulated from one another by an isolation 904 (e.g., including or made of fluorinated silicate glass, low-k dielectric, or any other suitable isolation material). The metallization layer 906 may be electrically insulated from the pad 902 by an insulating layer 905 disposed between the pad 902 and the metallization layer 906. The insulating layer 905 may, for example, be an oxide layer (e.g. $SiO_2$ layer).

Once the probe 901 (e.g., cantilever needle) contacts the pad 902, the probe-pad interaction (e.g., vertical and/or lateral displacement of the needle tip), represented by arrow 907 in FIG. 9, may cause pad surface deformation and/or scrub of pad material and may further cause crack formation in the insulating layer 905 below the pad 902. That is, one or more cracks 909 may evolve and extend through the insulating layer 905, and conductive material of the pad 902 and/or metallization layer 906 below may spread through the crack(s) 909. This may lead to a short circuit between pad 902 and metallization layer 906 below, which may deteriorate chip functionality or even render the chip inoperable.

The likelihood of crack formation may be influenced, inter alia, by characteristics of the probe card (e.g., probe technology, tip shape, or needle planarity), characteristics of the wafer (e.g., material properties, layer thickness, layout, inter-layer effects), and characteristics of the probing process (e.g., overdrive/probe force, number of touchdowns, cleaning). Various embodiments described herein may provide methods and/or devices to evaluate the influence of the latter (i.e., probing process characteristics) on crack formation and determine process windows for safe pad-probing, when the former (i.e., probe card characteristics and wafer characteristics) are given.

For example, in accordance with various embodiments, a process window for reliable pad processing (e.g., in terms of maximum allowable number of touchdowns and/or maximum allowable probe overdrive) may be determined for a given wafer/pad configuration and given probing process. In accordance with various embodiments, this may be achieved by analyzing the dependence of the probe-pad contact force on the probe overdrive.

An aspect of various embodiments may be seen in that the probe-force behavior undergoes a transition from a non-linear dependence on the probe overdrive (in a region of relatively low overdrives) to a linear dependence on the probe overdrive (in a region of relatively high overdrives). The region of non-linear dependence may correspond to a plastic deformation region of the pad, while the region of linear dependence may correspond to a linear-elastic deformation region, in which the pad may already have been thinned down to a critical thickness.

Figure 10:
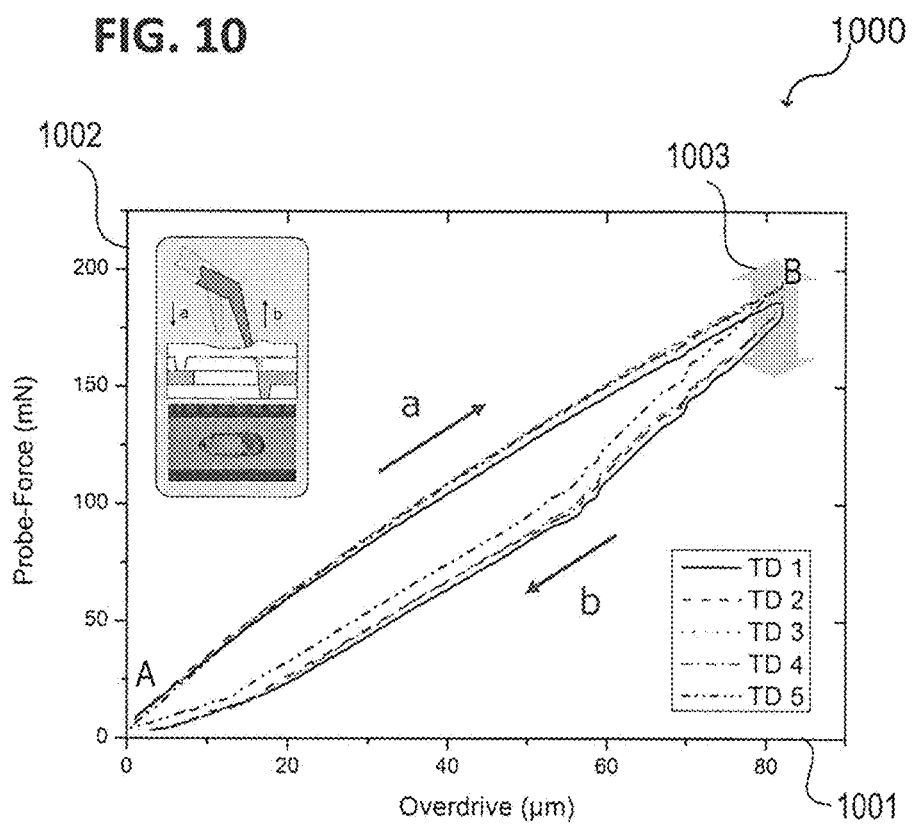
FIG. 10 shows a diagram showing probe force dependence on probe overdrive for illustrating one or more aspects of various embodiments.

FIG. 10 shows a diagram 1000 showing probe force dependence on probe overdrive for illustrating one or more aspects of various embodiments.

In the diagram 1000, a first axis 1001 denotes probe overdrive, and a second axis 1002 denotes probe force (contact force between probe and pad, e.g. a normal component $F_N$ of the contact force). Probe forces in dependence on probe overdrive have been measured for five contacting processes/touchdowns and are plotted as corresponding curves TD1, TD2, TD3, TD4, and TD5. In other words, curve TD1 corresponds to a first contacting process/touchdown, curve T2 corresponds to a second contacting process/touchdown, curve TD3 corresponds to a third contacting process/touchdown, curve TD4 corresponds to a fourth contacting process/touchdown, and curve TD5 corresponds to a fifth contacting process/touchdown. The contacting processes have been carried out at five different pads. That is, the first contacting process/touchdown has been carried out at a first pad, the second contacting process/touchdown has been carried out at a second pad, the third contacting process/touchdown has been carried out at a third pad, the fourth contacting process/touchdown has been carried out at a fourth pad, and the fifth contacting process/touchdown has been carried out at a fifth pad.

Each contacting process may include: initial touchdown of the probe on the pad surface (corresponding to point "A" in diagram 1000), increasing the probe overdrive and measuring corresponding probe forces (illustrated by arrow "a" in diagram 1000) up to a maximum overdrive (corresponding to point "B" in diagram 1000), decreasing the probe overdrive again and measuring corresponding probe forces (illustrated by arrow "b" in diagram 1000), and finally lift-off of the probe from the pad surface at point "A".

As may be noticed from diagram 1000, each touchdown may have slightly different force-displacement behavior of the probe, which is reflected in curves TD1 to TD5 being slightly different, as indicated by arrow 1003 in diagram 1000. For example, pad residues (e.g., aluminum residues in case of aluminum pads) from a previous probing may cause uncertainty in the force measurement of a subsequent probing.

As may also be noticed from diagram 1000, pulling the probe back from the pad (region "b" in diagram 1000) may result in a different force/overdrive behavior than pushing the probe towards the pad (region "a" in diagram 1000).

In order to account for differences in force-displacement behavior between individual probe-pad contacting processes and to obtain statistically significant results, a large number of measurements with randomized experimental setup may be carried out in accordance with some embodiments. For example, in accordance with some embodiments, the number of contacting processes (touchdowns) and/or force measurements carried out for one probe-pad qualification may be greater than or equal to 100, e.g. greater than or equal to 500, e.g. greater than or equal to 1000, e.g. greater than or equal to 5000, or even more.

Figure 11A:
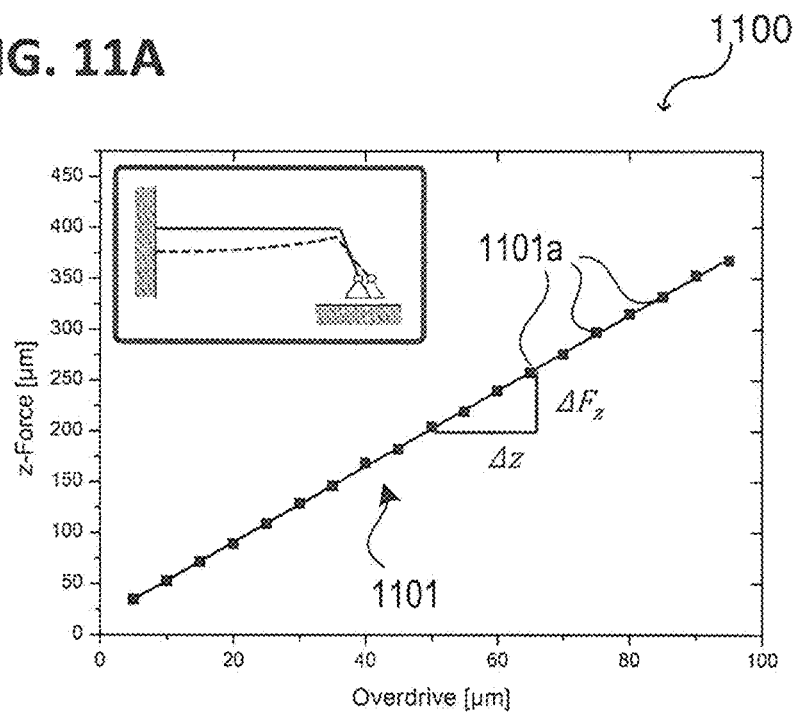
FIG. 11A and FIG. 11B show diagrams showing cantilever probe force dependencies on probe overdrive for illustrating one or more aspects of various embodiments.
Figure 11B:
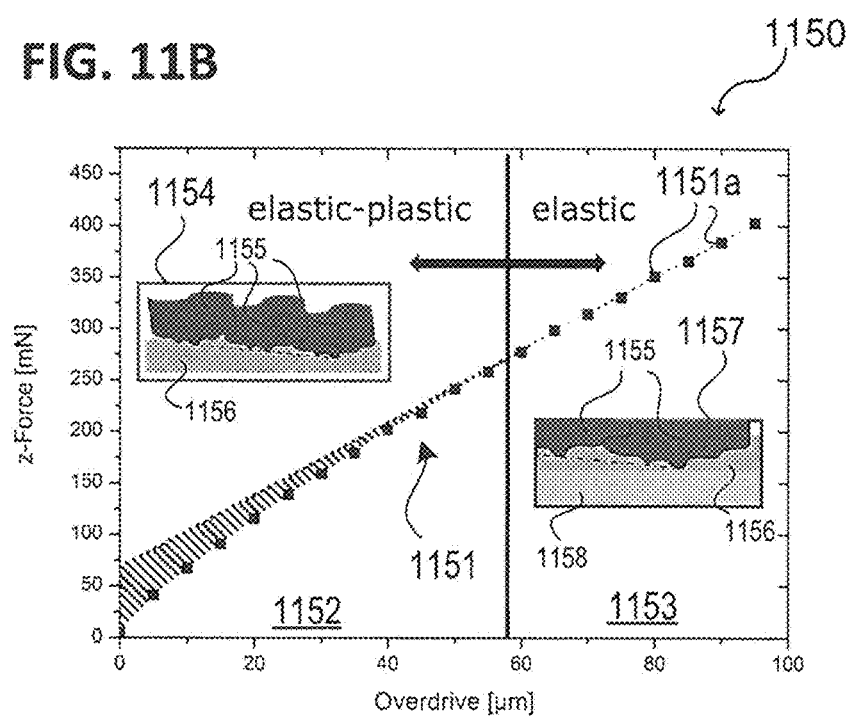

FIG. 11A and FIG. 11B show diagrams 1100 and 1150, respectively, showing cantilever probe force dependencies on probe overdrive for illustrating one or more aspects of various embodiments.

Diagram 1100 shows a dependence of probe force (normal component of contact force between probe and substrate, referred to as "z-Force" in diagram 1100) on probe overdrive for a cantilever probe on a glass substrate, as a comparative example. Probe forces have been measured for a plurality of discrete probe overdrive positions between a minimum overdrive of 5 µm and a maximum overdrive of 100 µm with an overdrive step size of 5 µm.

As may be noticed from diagram 1100, the force-displacement behavior, represented by graph 1101 including values 1101a, of the probe may be substantially linear over the entire range of probe overdrive positions between the minimum overdrive and maximum overdrive. The linear relationship between measured contact force and applied overdrive indicates that linear-elastic deformation of the probe (i.e., elastic bending of the cantilever needle) occurs over the entire range of overdrive positions.

Diagram 1150 shows a dependence of probe force (normal component of contact force between probe and pad, referred to as "z-Force" in diagram 1150) on probe overdrive for a cantilever probe on an aluminum pad. In accordance with the embodiment shown, probe forces have been measured for a plurality of discrete probe overdrive positions between a minimum overdrive of 5 µm and a maximum overdrive of 100 µm (overdrive step size of 5 µm) in a randomized measurement setup. Each value 1151a shown in diagram 1150 has been obtained by averaging a plurality of contacting processes (touchdowns).

As may be noticed from diagram 1150, the force-displacement behavior of the probe, represented by graph 1151 including values 1151a, changes from a non-linear behavior (region 1152) to a linear behavior (region 1153) with increasing probe overdrive. The non-linear probing behavior in region 1152 may correspond to a plastic deformation of the aluminum pad by the probe, an increase in contact surface, and an increase of friction with increasing probe overdrive. This is schematically illustrated by inset 1154 in diagram 1150, which shows the tip 1155 of the probe at three different locations at the pad 1156 corresponding to three different probe overdrives of increasing magnitude (from left to right). As may be seen, the scrub depth of the probe tip 1155 may increase with increasing probe overdrive. In this context, "scrub depth" may refer to a depth (measured from the pad surface), up to which the probe tip 1155 has penetrated the pad 1156 by scrubbing material of the pad 1156.

At some threshold value of the overdrive, e.g. about 58 nm in the example shown (the precise value may depend on characteristics of the particular probe/pad configuration, including, e.g., material and/or thickness of the pad, material and/or tip shape of the probe), the probing behavior may change to the linear probing behavior (region 1153). Above the threshold value, the aluminum pad may be thinned substantially (or the probe may even have pierced through the pad), friction between probe and pad may be continuous (or about constant), and the linear probing behavior may correspond to a linear-elastic deformation of the probe. This is schematically illustrated by inset 1157 in diagram 1150, which shows the tip 1155 of the probe at two different locations at the pad 1156 corresponding to two different probe overdrives of increasing magnitude (from left to right). As may be seen in 1157, a remaining thickness of pad material between the probe tip 1155 and an underlying layer 1158 (e.g., insulating layer, e.g. oxide layer) may be very small, or the probe tip 1155 may even have pierced through the pad 1156. In other words, the scrub depth may become equal or almost equal to the initial pad thickness.

Diagram 1150 is based on measurements carried out at aluminum pads. Similar diagrams as diagram 1150 may be obtained for other types of pads, e.g. other types of metal pads, e.g. copper pads, aluminum copper pads, gold pads, or others. In other words, the qualitative behavior of the dependence between contact force and probe overdrive may be similar or the same as in diagram 1150. Thus, in accordance with various embodiments, it may be possible to obtain force-displacement relationships for a variety of different probe/pad configurations, and for each probe/pad configuration it may be possible to determine a corresponding process window for reliable pad probing from the obtained force-displacement relationship.

In order to identify the linear region in the obtained force-displacement relationship (e.g., region 1153 in diagram 1150), a curve fitting process may be carried out in accordance with various embodiments, for example linear curve fitting using residual analysis as validation procedure in accordance with some embodiments, as will be described below.

Figure 12A:
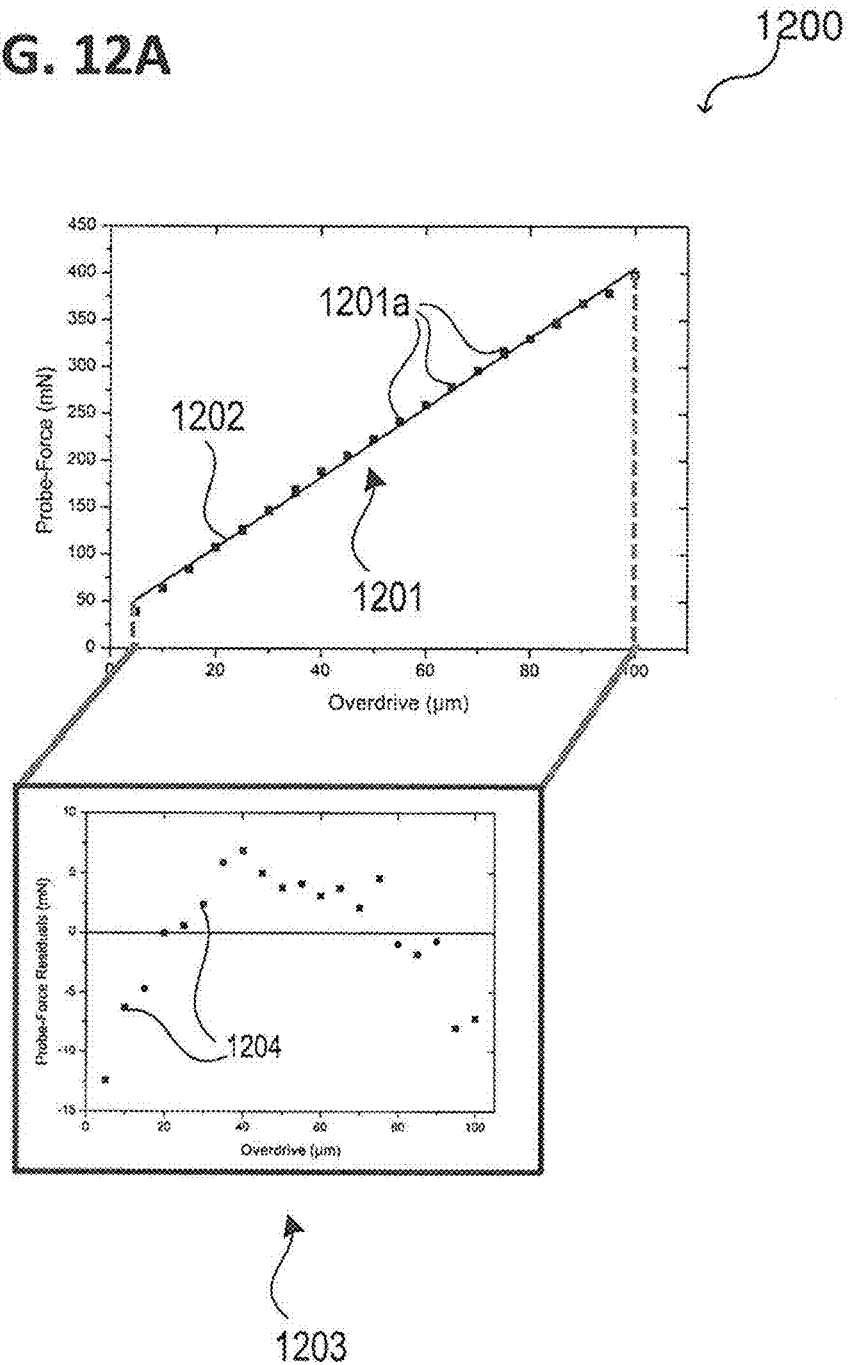
FIG. 12A and FIG. 12B show diagrams illustrating a linear curve fitting procedure for illustrating one or more aspects of various embodiments.
Figure 12B:
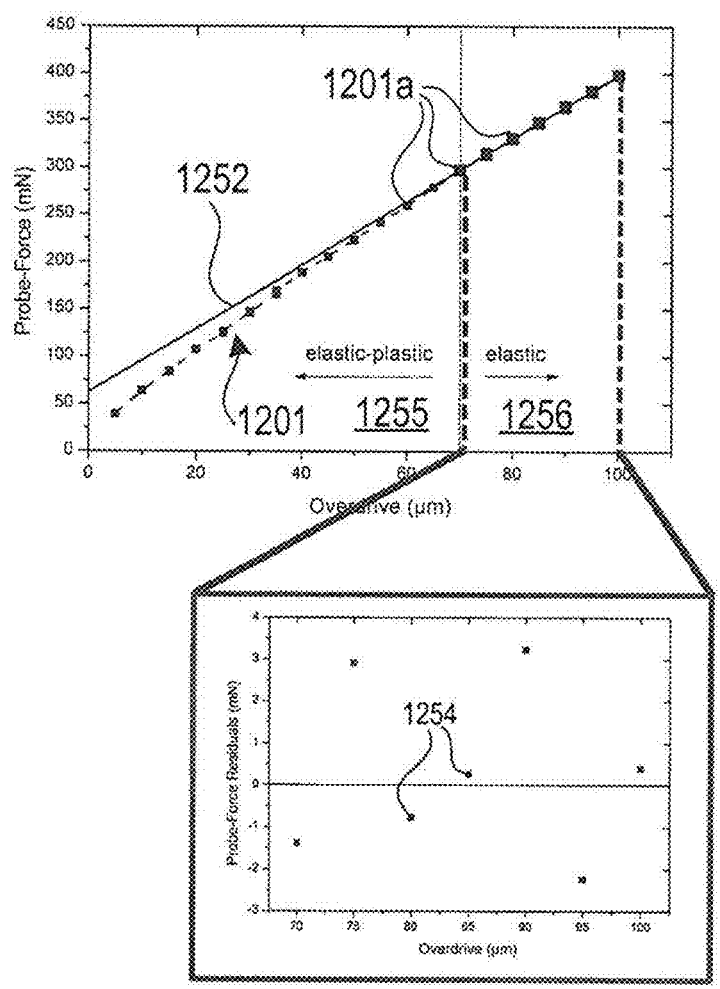

FIG. 12A and FIG. 12B show diagrams illustrating a linear curve fitting procedure carried out on a measured force-displacement relationship for illustrating one or more aspects of various embodiments.

Diagram 1200 in FIG. 12A shows a graph 1201 including values 1201a representing a relationship between probe force (contact force between probe and pad) and probe overdrive that may have been obtained in a similar manner as in diagram 1150. In a first iteration, a linear fitting operation has been carried out taking all of values 1201a of graph 1201 into account, which yields fitting curve 1202 (straight line). In order to validate accuracy of the linear fit, residual analysis may be carried out. Residuals (fitting deviations) 1204 of the linear fit are shown in diagram 1203. Each residual 1204 corresponds to a difference between a probe force value 1201a of graph 1201 for a particular probe overdrive position and the corresponding probe force value given by fitting curve 1202 for that probe overdrive position.

As may be seen from diagram 1203, with increasing probe overdrive the residuals 1204 first increase and then decrease again. In other words, the residuals 1204 show correlation. This indicates that the fitting curve 1202 may not be an accurate fit. In particular, this may indicate that the fitting curve 1202 is based not only on values 1201a of the graph 1201 belonging to a region of linear behavior of the graph 1201, but also on values 1201a belonging to a non-linear region of the graph 1201. Therefore, in a second iteration, the linear curve fitting may be repeated taking all values 1201a of graph 1201 except the first one (corresponding to 5 µm probe overdrive) into account, yielding a modified fitting curve and corresponding residuals. The residuals may be analyzed again, and based on the result of the analysis, another fitting iteration may be carried out taking all values 1201a of graph 1201 except the first two (corresponding to 5 µm and 10 µm overdrive) into account, yielding another modified fitting curve and corresponding residuals, which may be analyzed again. This process may be repeated until the residual analysis indicates that the obtained linear fit may be of sufficient accuracy.

Diagram 1250 in FIG. 12B shows again graph 1201 including values 1201a representing the measured probe force/overdrive relationship. Further shown is fitting curve 1252 obtained by linear fitting taking into account only the highest seven values of graph 1201 (i.e., values for probe overdrive positions from 70 µm to 100 µm). Diagram 1253 shows residuals 1254 obtained for the linear fit. As may be seen, the residuals 1254 appear to be uncorrelated. This indicates that the linear fit may be of sufficient accuracy. Therefore, a region of linear behavior of the probe-force (linear elastic region) may in this case be given by region 1256 between the two dashed lines in diagram 1250 including the probe overdrive positions from 70 µm to 100 µm, while probe overdrives lower than 70 µm may correspond to a region 1255 of non-linear probe-force behavior (e.g., region of plastic pad deformation).

Thus, in accordance with various embodiments, it may be possible to determine a first region of non-linear probe-force behavior (corresponding, e.g., to a region where the pad may be plastically deformed by the probe) and a second region of linear probe-force behavior (corresponding, e.g., to a region of linear elastic deformation of the probe, e.g. to a region of substantially reduced pad thickness or even fully pierced-through pad) using statistical analysis (e.g., linear curve fitting) of the measured probe forces (contact forces between probe and pad). This process may be carried out for a variety of different probe/pad configurations (e.g., different pad and/or probe materials).

Based on the determined first region and second region, it may be possible to determine a process window for reliable wafer probing. For example, in the embodiment of FIG. 12B, a region of "safe" probe overdrives in a wafer probing process, e.g. probe overdrives that may not lead to critical damage of the pad and/or layers below the pad (e.g., cracks in insulating layers below the pad), may be given by region 1255 in diagram 1250. Thus, the wafer probing process may be configured such that a maximum probe overdrive in the wafer probing process may be less than or equal to about 70 µm in this embodiment (e.g., less than or equal to about 70 µm minus some additional safety tolerance/margin in accordance with some embodiments).

Figure 13:
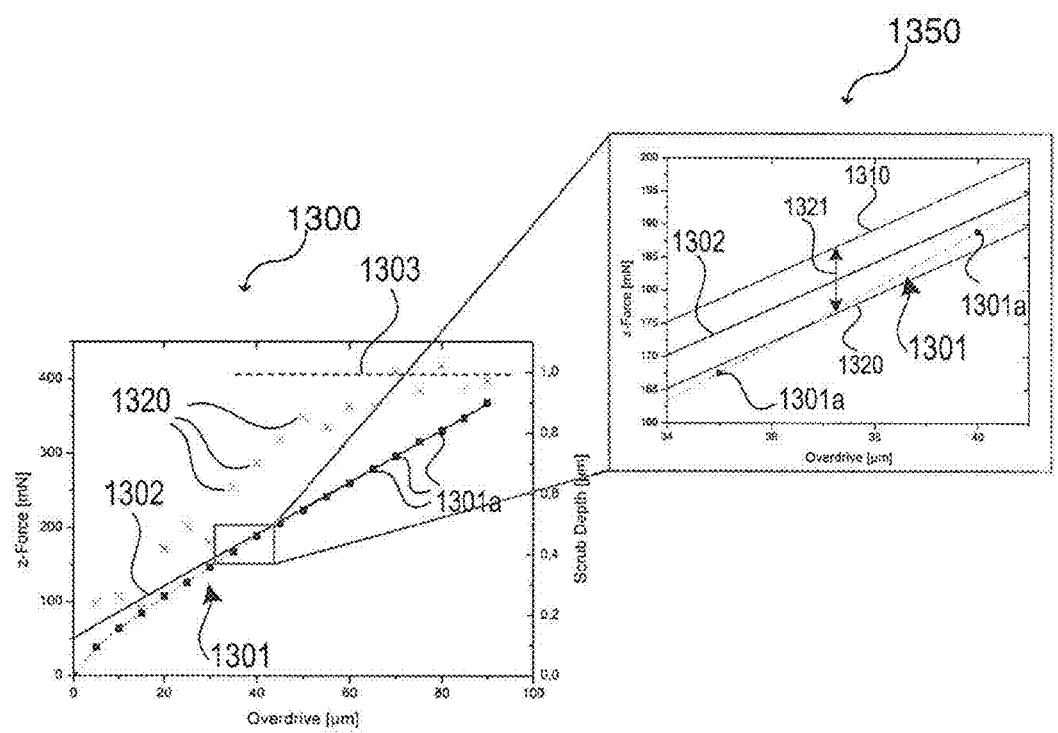
FIG. 13 shows diagrams illustrating definition of a linear-elastic deformation region in accordance with an aspect of various embodiments.

FIG. 13 shows diagrams 1300 and 1350 illustrating definition of a linear-elastic deformation region in accordance with an aspect of various embodiments.

Diagram 1300 shows a measured probe-force displacement behavior, represented by graph 1301 including values 1301a, for a measurement with a cantilever probe at an aluminum copper pad. Each value 1301a was obtained by averaging five force measurements at five different pads for the respective probe overdrive position. Curve 1302 was obtained by a linear fit, for example in a similar manner as described herein above in connection with FIGS. 12A and 12B. In addition, scrub depths of the probe were measured for each probe overdrive position and are plotted as values 1320 in diagram 1300. As may be seen from diagram 1300, with increasing probe overdrive the probe-force displacement behavior 1301 converges towards linear elastic probing behavior and also the scrub depth (in other words, penetration depth) of the probe may saturate (in this example, at a value close to 1 µm indicated by dashed line 1303).

Diagram 1300 illustratively shows that, upon transition of the probe-force curve (graph 1301) to linear behavior, also the measured probe penetration depth (scrub depth) saturates. In accordance with various embodiments, it is thus possible to determine a dangerous piercing-through of the pad by means of force measurements only.

Diagram 1350 shows how the linear region may be determined in accordance with some embodiments. Diagram 1350 shows an enlarged section of diagram 1300 close to a transition from non-linear to linear behavior of graph 1301. Diagram 1350 shows fitting curve 1302 obtained by the linear fit, and additionally shows an upper boundary curve 1310 and a lower boundary curve 1320 parallel to curve 1302. Upper boundary curve 1310 may be obtained by adding an upper safety margin to fitting curve 1302, and lower boundary curve 1320 may be obtained by subtracting a lower safety margin from fitting curve 1302. In one or more embodiments, upper and lower safety margin may be of the same magnitude. In the example shown, upper and lower safety margin are 5 mN so that a safety or tolerance region of 10 mN width (indicated by arrow 1321) and centered at curve 1302 is obtained, however other values of the upper and/or lower safety margin may be possible.

In one or more embodiments, the upper and/or lower safety margin (or tolerance) may correspond or be equal to a maximum of the absolute values of the residuals obtained in the fitting process, on which fitting curve 1302 is based. For example, in the case of fitting curve 1252 shown in FIG. 12B, an upper and/or lower safety margin or tolerance may correspond or be equal to a maximum of the absolute values of the residuals 1254 shown in diagram 1253. In general, the upper and/or lower safety margin may, for example, depend on the number of experiments (for example, the number of measurements used for averaging).

Based on the fitting curve 1302 and added safety margins (or tolerances), the transition point from non-linear probe-force behavior to linear probe-force behavior may be defined as the crossing of graph 1301 and lower boundary curve 1320 in accordance with some embodiments. In the example shown, the crossing occurs at a probe overdrive of about 36.5 µm, which may thus define the maximum permitted overdrive in a process window for a corresponding wafer probing process. In other words, in a wafer probing process using similar or the same probes at similar or the same pads as applied for the measurements of FIG. 13, probe overdrives may be chosen to be less than or equal to about 36.5 µm in order to avoid damage to the pads and/or layers below the pads. As will be readily understood, other values for the maximum permitted overdrive may be obtained for other probe/pad configurations.

Figure 14:
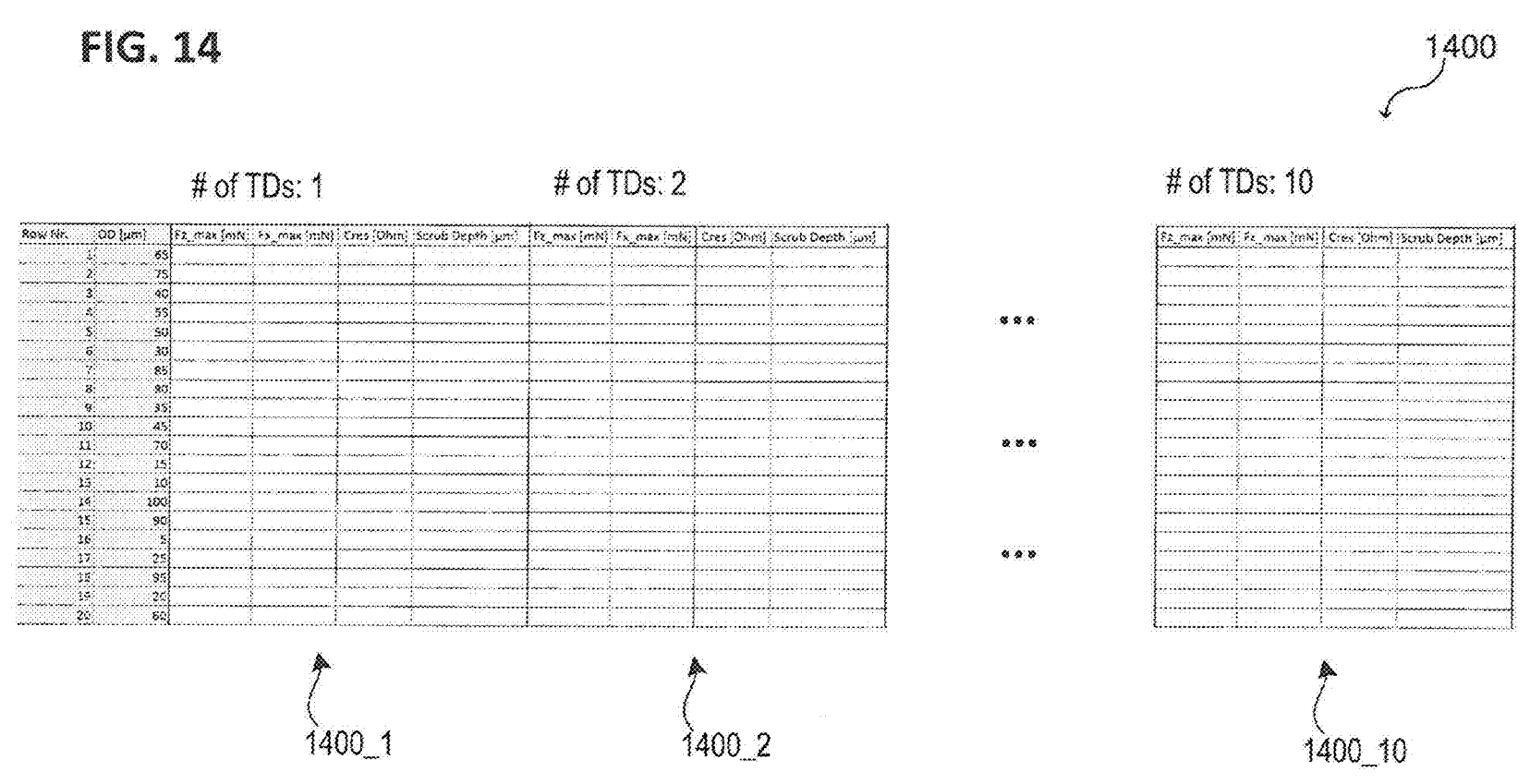

FIG. 14 shows a table 1400 corresponding to an exemplary measurement setup for a randomized measurement of probe-pad contact forces at a plurality of pads, for illustrating one or more aspects of various embodiments.

The pads may be arranged in a grid array design including rows and columns. According to the embodiment shown, the contact forces may be measured for probe overdrive positions ranging from 5 µm up to 100 µm in steps of 5 µm, thus yielding 20 different probe overdrive positions ("5 µm", "10 µm, "15 µm", . . . , "95 µm", "100 µm"). Also, the contact forces may be measured for various numbers of probe touchdowns ranging from 1 to 10 in steps of 1, thus yielding 10 different numbers of touchdowns.

Correspondingly, the grid array may include 20 rows and 10 columns, wherein each row may correspond to a particular probe overdrive position and each column may correspond to a particular number of touchdowns. As will be readily understood, the number of probe overdrive positions and/or the step size may be different, yielding a different number of rows in the grid array. Similarly, the number of measurements corresponding to different numbers of touchdowns and/or the step size may be different, yielding a different number of columns in the grid array.

The first column of table 1400 labelled "Row Nr." indicates the row number of the grid array, and the second column of table 1400 labelled "OD [µm]" indicates the probe overdrive position, for which the probe-pad contact force is to be measured. As may be seen, the probe overdrive positions are not in a consecutive order starting with the lowest overdrive and ending with the highest overdrive (i.e., "5 µm", "10 µm", "15 µm", "20 µm", . . . , "95 µm", "100 µm"), but are in a randomized order (i.e., "65 µm", "75 µm", "40 µm", "55 µm", . . . , "95 µm", "20 µm", "60 µm") in order to reduce or eliminate influences of continuous pad contamination. As will be readily understood, the order shown in table 1400 is just one example of a randomized order, other orders may be possible as well.

In the third through sixth columns of table 1400 (section 1400_1 labelled "# of TDs: 1"), measurement results obtained after a single probe touchdown at each pad may be taken down. In the seventh through tenth columns of table 1400 (section 1400_2 labelled "# of TDs: 2"), measurement results obtained after two probe touchdowns at each pad may be taken down, In the eleventh through fourteenth columns of table 1400, measurement results obtained after three probe touchdowns at each pad may be taken down, etc., and in the last four columns of table 1400 (section 1400_10 labelled "# of TDs: 10"), measurement results obtained after 10 probe touchdowns at each pad may be taken down.

The third to sixth columns (section 1400_1) of table 1400 correspond to measurements obtained after a single probe touchdown at each pad. In this case, and in accordance with various embodiments, each individual measurement may include bringing the probe in contact with a pad (initial touchdown), bringing the probe to a respective overdrive position (e.g., by moving the probe and/or moving the pad), e.g. to an overdrive position of 65 µm for a pad in the first row and first column of the grid array or to an overdrive position of 35 µm for a pad in the ninth row and first column of the grid array, measuring the contact force (and optionally one or more other variables, such as contact resistance) between probe and pad for this overdrive position. After an individual measurement, the probe may be brought back to a position where it is not in contact with the pad before carrying out a subsequent measurement at the next pad.

In the third column labelled "Fz_max [mN]" and the fourth column labelled "Fx_max [mN]", the vertical component and lateral component of the probe-pad contact force measured for the corresponding overdrive position may be taken down in accordance with various embodiments. In the fifth column labelled "Cres [Ohm]", an electrical contact resistance measured between probe and pad may be taken down for the corresponding overdrive position in accordance with some embodiments. The contact resistances may be measured optionally and may, for example, be used to determine a minimum overdrive position in a process window. In the sixth column labelled "Scrub Depth [µm]" a scrub depth (penetration depth) measured for the corresponding overdrive position may be taken down in accordance with some embodiments. The scrub depths may be measured optionally at the end of the overall measurement series (for example, by confocal microscopy) and may, for example, be used for comparison with the force measurements. However, it should be noted that the measurement of the scrub depth is not required to determine the first region (region of non-linear behavior of probe force) and second region (region of linear behavior of probe force) and/or the process windows.

The seventh to tenth columns (section 1400_2) of table 1400 correspond to measurements obtained after two probe touchdowns at each pad. In this case, and in accordance with various embodiments, each individual measurement may include bringing the probe in contact with a pad for a first time (first touchdown), bringing the probe to a respective overdrive position (e.g., by moving the probe and/or moving the pad), e.g. to an overdrive position of 65 µm for a pad in the first row and second column of the grid array or to an overdrive position of 35 µm for a pad in the ninth row and second column of the grid array, bringing the probe back to a position where it is not in contact with the pad, bringing the probe in contact with the pad for a second time (second touchdown), bringing the probe to the respective overdrive position again, and measuring the contact force (and optionally one or more other variables, such as contact resistance) between probe and pad for this overdrive position. After an individual measurement, the probe may be brought back to a position where it is not in contact with the pad before carrying out a subsequent measurement at the next pad. For each touchdown at the pad, the probe may be placed at the same or substantially the same lateral position at the pad.

Similarly as for the single touchdown measurements where the measurement results may be taken down in section 1400_1 of table 1400, the measurement results (i.e., contact forces, contact resistances (optional), scrub depths (optional)) obtained after two touchdowns at each pad may be taken down in section 1400_2 of table 1400.

The eleventh to fourteenth columns of table 1400 correspond to measurements obtained after three probe touchdowns at each pad. In this case, and in accordance with various embodiments, each individual measurement may include bringing the probe in contact with a pad for a first time (first touchdown), bringing the probe to a respective overdrive position (e.g., by moving the probe and/or moving the pad), e.g. to an overdrive position of 65 μm for a pad in the first row and third column of the grid array or to an overdrive position of 35 μm for a pad in the ninth row and third column of the grid array, bringing the probe back to a position where it is not in contact with the pad, bringing the probe in contact with the pad for a second time (second touchdown), bringing the probe to the respective overdrive position again, bringing the probe back to a position where it is not in contact with the pad, bringing the probe in contact with the pad for a third time (third touchdown), bringing the probe to the respective overdrive position again, and measuring the contact force (and optionally one or more other variables, such as contact resistance) between probe and pad for this overdrive position. After an individual measurement, the probe may be brought back to a position where it is not in contact with the pad before carrying out a subsequent measurement at the next pad. For each touchdown at the pad, the probe may be placed at the same or substantially the same lateral position at the pad.

The measurement results may be taken down in table 1400 in the corresponding section.

Corresponding measurements may be carried out for cases with four touchdowns, five touchdowns, six touch touchdowns, etc., and ten touchdowns, and the measurement results may be taken down in the corresponding sections of table 1400. For each touchdown at a pad, the probe may be placed at the same or substantially the same lateral position at the pad.

As described above, the grid array may be of size 20 rows×10 columns in this example, yielding 200 individual measurements. Furthermore, each measurement series (i.e., the measurement series with 1 touchdown (section 1400_1), the measurement series with 2 touchdowns (section 1400_2), the measurement series with 3 touchdowns (section 1400_3), etc.) may be repeated in a number of experiments in order to obtain improved statistics (by averaging of results). For example, the number of experiments may be in the range from 5 to 30, e.g. in the range from 5 to 10, e.g. 5 experiments, e.g. 10 experiments, which may result in a total number of 1000 to 6000 probe-pad contacting processes (touchdowns per pad) to be carried out for one probe pad qualification, in accordance with some embodiments.

Once the measurement values for the contact forces have been acquired, the measurement results may be statistically analyzed as described herein above, e.g. including averaging the measurement values for each probe overdrive position and performing linear curve fitting on the obtained force-displacement curve to determine the regions of non-linear and linear probe-force behavior. As a result, process windows for reliable wafer probing may be obtained for one or more probe-pad combinations. In accordance with various embodiments, the (e.g., several thousand) probe-pad contacting processes (touchdowns) and subsequent evaluation may be carried out in an automated way within a few hours, which is significantly faster compared to the above-mentioned conventional methods of damage detection (optical inspection, chemical preparation).

Figure 15:
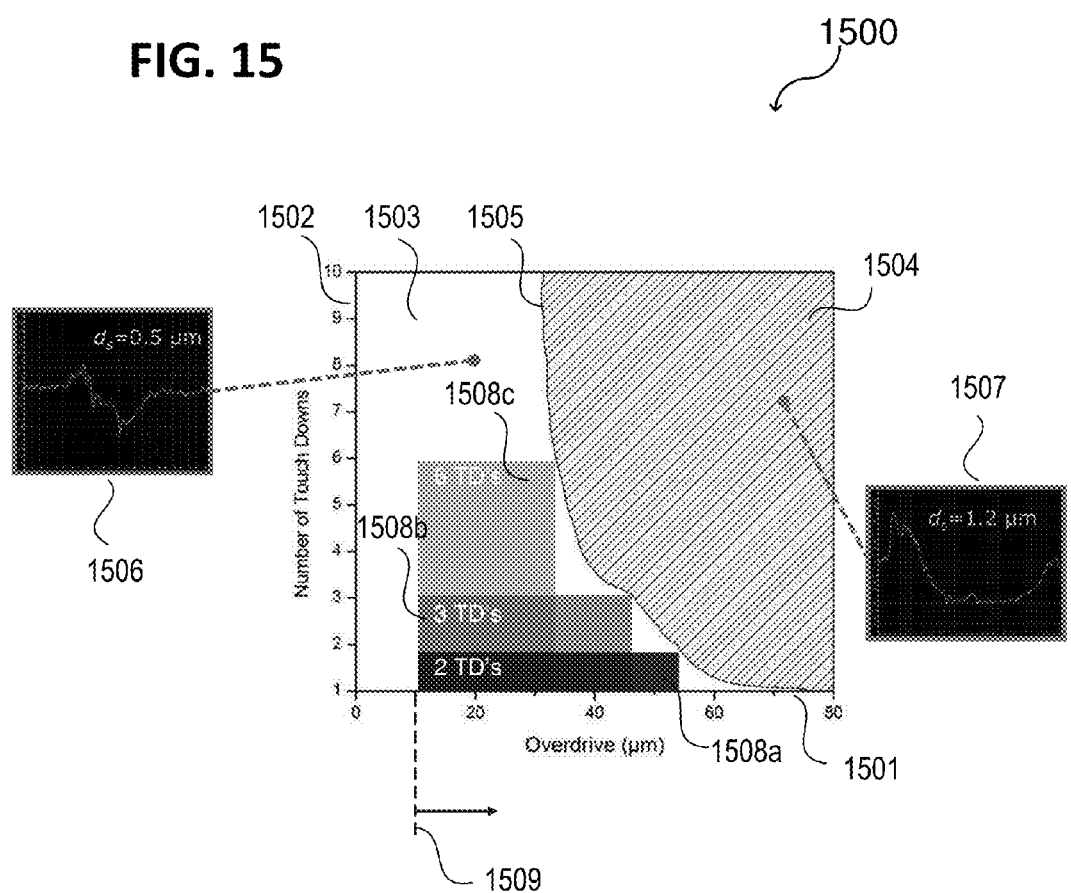
FIG. 15 shows a diagram illustrating process windows obtained through an automated probe-pad qualification method in accordance with various embodiments.

FIG. 15 shows a diagram 1500 illustrating exemplary process windows obtained through an automated probe-pad qualification method in accordance with various embodiments.

In diagram 1500, a first axis 1501 denotes probe overdrive and a second axis 1502 denotes number of touchdowns (at a pad). Diagram 1500 includes a first region 1503 and a second region 1504 divided by boundary line 1505. The first region 1503 corresponds to a region, in which the pad may be plastically deformed by a probe, and the second region 1504 may correspond to a region of linear-elastic probing behavior, in which the probe (e.g., needle) might cause quality relevant damages because the protecting pad may have been thinned down to a critical thickness or may already have been pierced through by the probe (e.g., needle). As an illustration, views 1506 and 1507 show exemplary cross-sectional profiles of pads and corresponding scrub depths ds obtained at exemplary locations in region 1503 and region 1504, respectively. As may be seen, the scrub depth in the region 1504 of linear-elastic deformation may be considerably higher than the scrub depth in the region 1503 of elastic-plastic deformation.

From diagram 1500, process windows 1508a, 1508b, 1508b in dependence on number of touch downs and overdrive may be defined with high accuracy. In particular, process window 1508a may be defined for a wafer probing process where a probe performs (at most) two touchdowns at the same pad. According to process window 1508a, safe probing may be carried out for probe overdrives of up to about 54 μm in this case. Similarly, process window 1508b may be defined for a wafer probing process where a probe performs (at most) three touchdowns at the same pad. According to process window 1508b, safe probing may be carried out for probe overdrives of up to about 46 μm in this case. Furthermore, process window 1508c may be defined for a wafer probing process where a probe performs (at most) six touchdowns at the same pad. According to process window 1508c, safe probing may be carried out for probe overdrives of up to about 32 μm. Process windows 1508a, 1508b, 1508c may also include a minimum probe overdrive 1509, for example about 10 μm in the example shown, as a boundary condition, which may account for reliable wafer testing in terms of electrical contact requirements. In other words, a minimum overdrive may be set to obtain an electrical contact resistance between probe and pad that is lower than some predeterminable threshold.

In accordance with some embodiments, the process windows may further account for other influences such as, e.g., probe card/chuck planarity and/or needle tolerances.

The process windows 1508a, 1508b, 1508c may apply for a particular probe/pad combination. However, as will be readily understood, similar process windows may be obtained for other probe/pad combinations in accordance with various embodiments.

Various embodiments provide methods and devices for automated probe-pad qualification (e.g., PoAA qualification) based on probe-force measurements and analyses. The measurements may be carried out fully automatically and may, for example, be implemented as software upgrade in an existing probing apparatus in accordance with some embodiments. The measurements and analyses may be carried out within hours (e.g., overnight measurement). An automated process window definition may be achieved, e.g. including optimal probing parameters. In accordance with some embodiments, a script based interpretation may be possible.

In the following, further embodiments and aspects are described.

A method in accordance with various embodiments may include: measuring a contact force between at least one probe and at least one contact pad for a plurality of probe overdrive positions, and determining a relationship between contact force and probe overdrive position from the measured contact forces; determining a first region in the relationship exhibiting a non-linear dependence of the contact force from the probe overdrive position, and a second region exhibiting a linear dependence of the contact force from the probe overdrive position; and determining a process window for a pad probing process based on the determined first region and second region.

In one or more embodiments, measuring the contact force may include measuring a vertical component (normal component) of the contact force. The vertical component (normal component) of the contact force may be a component perpendicular, or at least substantially perpendicular, to the pad surface.

In one or more embodiments, measuring the contact force may include measuring a horizontal component (lateral component) of the contact force. The horizontal component (lateral component) of the contact force may be a component parallel, or at least substantially parallel, to the pad surface.

In one or more embodiments, determining the first region may include determining a first interval of probe overdrive positions, in which the contact force depends non-linearly from the probe overdrive position, and determining the second region may include determining a second interval of probe overdrive positions, in which the contact force depends linearly from the probe overdrive position. The first interval and the second interval may be non-overlapping intervals. The probe overdrive positions in the first interval may be smaller than the probe overdrive positions in the second interval.

In one or more embodiments, measuring a contact force between at least one probe and at least one contact pad may include: measuring a contact force between a probe and a contact pad for a first probe overdrive position at a first lateral probe position at the contact pad; and measuring a contact force between the probe and the contact pad for a second probe overdrive position at a second lateral probe position at the contact pad.

In one or more embodiments, measuring a contact force between at least one probe and at least one contact pad may include: measuring, in a first measurement, a contact force between a probe and a contact pad for a first plurality of probe overdrive positions ranging from a first minimum probe overdrive position to a first maximum probe overdrive position; and subsequently measuring, in a second measurement, a contact force between the probe and the contact pad for a second plurality of probe overdrive positions ranging from a second minimum probe overdrive position to a second maximum probe overdrive position.

In one or more embodiments, in the second measurement, the probe may be placed at the same lateral position at the pad as in the first measurement.

In one or more embodiments, in the second measurement, the probe may be placed at a different lateral position at the pad than in the first measurement.

In one or more embodiments, measuring a contact force between at least one probe and at least one contact pad may include: measuring a contact force between a probe and a first contact pad for a first probe overdrive position; and measuring a contact force between the probe and a second contact pad for a second probe overdrive position, wherein the second probe overdrive position is different from the first probe overdrive position.

In one or more embodiments, measuring a contact force between at least one probe and at least one contact pad may include measuring a contact force between at least one probe and at least one contact pad for a plurality of probe overdrive positions ranging from a minimum probe overdrive position to a maximum probe overdrive position.

In one or more embodiments, measuring a contact force between at least one probe and at least one contact pad may include: measuring a contact force between a probe and a first contact pad for a first plurality of probe overdrive positions ranging from a first minimum probe overdrive position to a first maximum probe overdrive position; and measuring a contact force between the probe and a second contact pad for a second plurality of probe overdrive positions ranging from a second minimum probe overdrive position to a second maximum probe overdrive position.

In one or more embodiments, measuring a contact force between at least one probe and at least one contact pad may include: measuring a contact force between a first probe and a first contact pad for a first plurality of probe overdrive positions ranging from a first minimum probe overdrive position to a first maximum probe overdrive position; and measuring a contact force between a second probe and a second contact pad for a second plurality of probe overdrive positions ranging from a second minimum probe overdrive position to a second maximum probe overdrive position.

In one or more embodiments, the second plurality of probe overdrive positions may be the same as the first plurality of probe overdrive positions.

In one or more embodiments, the second plurality of probe overdrive positions may be different from the first plurality of probe overdrive positions.

In one or more embodiments, measuring a contact force between at least one probe and at least one contact pad may include the following steps: a) performing a touchdown of a probe on a first contact pad; b) subsequently bringing the probe to a first probe overdrive position; c) subsequently bringing the probe back from the first probe overdrive position to a position where the probe is not in contact with the first contact pad; d) subsequently performing a touchdown of the probe on the first contact pad; e) subsequently bringing the probe to the first probe overdrive position; and f) subsequently measuring the contact force for the first probe overdrive position. That is, the contact force for the first probe overdrive position may be measured after at least two touchdowns of the probe on the first contact pad. The at least two touchdowns of the probe may be at the same or substantially the same lateral position at the pad.

In one or more embodiments, steps a)-c) may be repeated at least once before carrying out step d). That is, the contact force for the first probe overdrive position may be measured after at least three touchdowns of the probe on the first contact pad.

In one or more embodiments, measuring a contact force between at least one probe and at least one contact pad may further include the following steps after step f): g) performing a touchdown of the probe on a second contact pad; h) subsequently bringing the probe to a second probe overdrive position; i) subsequently bringing the probe back from the second probe overdrive position to a position where the probe is not in contact with the second contact pad; j) subsequently performing a touchdown of the probe on the second contact pad; k) subsequently bringing the probe to the second probe overdrive position; and l) subsequently measuring the contact force for the second probe overdrive position. That is, the contact force for the second probe overdrive position may be measured after at least two touchdowns of the probe on the second contact pad.

In one or more embodiments, steps g)-i) may be repeated at least once before carrying out step j). That is, the contact force for the second probe overdrive position may be measured after at least three touchdowns of the probe on the second contact pad. The at least three touchdowns of the probe may be at the same or substantially the same lateral position at the pad.

In one or more embodiments, the number of touchdowns on the first contact pad may be the same as the number of touchdowns on the second contact pad.

In one or more embodiments, the aforementioned force measurement scheme may be repeated for measuring a contact force corresponding to a third probe overdrive position at a third contact pad, and possibly measuring contact forces for additional probe overdrive positions at additional contact pads.

Illustratively, multiple touchdowns may be carried out at each contact pad before a contact force is measured for a respective probe overdrive position at the respective contact pad.

In one or more embodiments, performing a touchdown of a probe may include at least one of moving the probe or moving the pad (e.g., a wafer including the pad).

In one or more embodiments, bringing the probe to a probe overdrive position may include at least one of moving the probe or moving the pad (e.g., the wafer including the pad).

In one or more embodiments, measuring a contact force between at least one probe and at least one contact pad may include measuring a contact force between at least one probe and a plurality of contact pads so as to obtain a plurality of measurement values for each of the probe overdrive positions, and averaging the plurality of measurement values for each of the probe overdrive positions.

In one or more embodiments, measuring a contact force between at least one probe and at least one contact pad may include providing a randomized measurement setup, in which contact forces for a plurality of probe overdrive positions are measured at a respective plurality of contact pads.

In one or more embodiments, the number of probe overdrive positions, for which the contact forces may be measured, may be greater than or equal to 5, e.g. greater than or equal to 10, e.g. greater than or equal to 20, e.g. greater than or equal to 50, e.g. greater than or equal to 100.

In one or more embodiments, measuring a contact force between at least one probe and at least one contact pad may include measuring N contact forces for N different probe overdrive positions at N different contact pads. In one or more embodiments, N may be a positive integer greater than or equal to 5, e.g. greater than or equal to 10, e.g. greater than or equal to 20, e.g. greater than or equal to 50, e.g. greater than or equal to 100.

In one or more embodiments, the at least one probe may include a cantilever probe.

In one or more embodiments, the at least one probe may be a single probe, e.g. a single cantilever probe.

In one or more embodiments, the at least one probe may include a probe card including a single probe.

In one or more embodiments, the at least one probe may include a probe card including a plurality of probes, e.g. a plurality of cantilever probes.

In one or more embodiments, measuring a contact force between at least one probe and at least one contact pad may include measuring a normal force (in other words, a normal or vertical component of a contact force) between the at least one probe and the at least one contact pad.

In one or more embodiments, the at least one probe may be made of a material that is harder than a material of the contact pad.

In one or more embodiments, the at least one probe may include at least one of an alloy containing tungsten and rhenium or an alloy containing copper and beryllium. However, the at least one probe may include or may be made of other materials in accordance with some embodiments.

In one or more embodiments, the at least one contact pad may include or may be made of metal or a metal alloy.

In one or more embodiments, the at least one contact pad may include or may be made of at least one of aluminum, copper, an alloy containing aluminum and copper, gold.

In one or more embodiments, the at least one contact pad may have a thickness in the range of about 200 nm to about 15 µm, for example about 1000 nm, however other values may be possible as well.

In one or more embodiments, the at least one contact pad may include or may be made of a single layer. In one or more embodiments, the at least one contact pad may include or may be made of a layer stack including a plurality of layers.

In one or more embodiments, the at least one contact pad may be disposed over an active area of a chip. The term "active area" may, for example, refer to an area of the chip where one or more electrical devices or elements, e.g. passive and/or active circuit elements, of the chip are located. The active area of a chip may also be referred to as a device area of the chip. In one or more embodiments, the active area or device area may be located at or proximate a front side of the chip.

In one or more embodiments, the chip may be part of a wafer including a plurality of chips, e.g. a silicon wafer, however any other type of wafer may be possible as well.

In one or more embodiments, the method may further include measuring a contact resistance between the at least one probe and the at least one contact pad for each position of the plurality of probe overdrive positions.

In one or more embodiments, measuring a contact force between the at least one probe and the at least one contact pad may include: bringing the at least one probe and the at least one contact pad in contact with one another; and subsequently at least one of moving the at least one contact pad towards the at least one probe or moving the at least one probe towards the at least contact pad.

In one or more embodiments, the method may further include providing a calibration wafer including the at least one contact pad.

In one or more embodiments, the calibration wafer may include a plurality of dies. The at least one contact pad may be at least one contact pad of at least one die of the plurality of dies. For example, each die may include one or a plurality of contact pads.

In one or more embodiments, the at least one contact pad may be disposed over (e.g., on) an insulating layer (e.g., an oxide layer, or the like).

In one or more embodiments, the first region exhibiting the non-linear dependence of the contact force from the probe overdrive position may correspond to a region, in which the contact pad is plastically deformed by the probe. In other words, plastic deformation of the contact pad by the probe (e.g., needle) during a pad probing process may be reflected in a non-linear relationship between contact force and probe overdrive position. In still other words, if measured contact forces are plotted vs. probe overdrive positions, a resulting graph or curve may include a non-linear section, which may correspond to the plastic deformation region.

In one or more embodiments, the second region exhibiting the linear dependence of the contact force from the probe overdrive position may correspond to a region, in which the probe (e.g., needle) has fully pierced through the pad or in which the residual thickness of the pad below the probe (e.g., needle) is less than a given minimum thickness. In other words, piercing through the contact pad by the probe (e.g., needle) during a pad probing process may be reflected in a linear relationship between contact force and probe overdrive position. In still other words, if measured contact forces are plotted vs. probe overdrive positions, a resulting graph or curve may include a linear section, which may correspond to the region where the probe (e.g., needle) has fully pierced through the pad or the residual pad thickness is less than some minimum thickness.

In one or more embodiments, determining the first region and second region may include determining a transition point (or transition region) between the first region and the second region. The transition point (or region) may correspond to an overdrive position (or range of overdrive positions) where the force vs. probe overdrive relationship changes from the non-linear dependence to the linear dependence. In general, the location of this transition point (or region) may depend on the number of probe-pad contacts (touchdowns). For example, in case of a single touchdown the transition point (or region) may be at a higher value of the probe overdrive, whereas in case of two or more touchdowns (at the same pad) the transition point (or region) (for the second and further touchdowns) may be at a lower value of the probe overdrive because the pad may have been thinned already by the previous touchdown or touchdowns.

In one or more embodiments, determining the first region and second region may include performing a curve fitting process.

In one or more embodiments, the curve fitting process may include performing a linear fit.

In one or more embodiments, the curve fitting process may include performing a residual analysis (in other words, analysis of fitting deviations).

In one or more embodiments, determining the first region and second region may include determining a function (f) representing the relationship between probe-pad contact force (F) and probe overdrive position (z), and determining the derivative (f') of the function (f). The second region may correspond to a region where the derivative (f') is constant or at least substantially constant (i.e., f'≅const.). In other words, in the second region (region of linear dependence), the derivative (f') may not change or change only negligibly.

In one or more embodiments, the method may further include determining a scrub depth of the at least one probe for the plurality of probe overdrive positions.

In one or more embodiments, the process window may be defined in a parameter space including a number of probe-pad contacts (touchdowns) and the probe overdrive position as parameters.

In one or more embodiments, the process window may correspond to a region in the parameter space, in which a pad or wafer probing process may safely operate, e.g. without damaging structures below the pad, e.g. without causing cracks in an insulating layer (e.g., an oxide layer) below the pad, which may lead to short circuits.

In one or more embodiments, the process window may include at least one of a maximum allowed probe overdrive position for a given number of probe-pad contacts (touchdowns) or a maximum allowed number of probe-pad contacts (touchdowns) for a given probe overdrive position. In other words, the process window may define a maximum allowed probe overdrive position ($z_{max}$) that may be attained by a probe in a pad probing process for a given number of touchdowns of the probe (contacts of the probe with the pad). For example, if the probe contacts the pad only once, a maximum allowed probe overdrive position may be $z_{max,1}$, if the probe contacts the pad twice, a maximum allowed probe overdrive position (for each of the touchdowns) may be $z_{max,2}$, if the probe contacts the pad three times, a maximum allowed probe overdrive position (for each of the touchdowns) may be $z_{max,3}$, . . . , if the probe contacts the pad n times, a maximum allowed probe overdrive position (for each of the n touchdowns) may be $z_{max,n}$. The following may hold true: $z_{max,n} \leq z_{max,n-1} \leq z_{max,n-2} \leq \ldots \leq z_{max,2} \leq z_{max,1}$.

In one or more embodiments, the process window may be further determined by a predeterminable maximum contact resistance. For example, achieving a contact resistance (between probe and pad) that is lower than the predeterminable maximum contact resistance may require a probe overdrive that is larger than a predeterminable minimum probe overdrive.

In one or more embodiments, the method may further include carrying out a pad probing process using the determined process window.

In one or more embodiments, determining the first region and the second region may include determining a probe overdrive position threshold value, wherein the first region includes probe overdrive position values below the threshold value and the second region includes probe overdrive positions above the threshold value. In one or more embodiments, the threshold value may correspond to the aforementioned transition point.

A method for automated probe-pad qualification in accordance with various embodiments may include: measuring probe-pad contact forces for a plurality of probe overdrive positions; statistically analyzing the measured contact forces so as to determine a parameter region for reliable pad probing. The method may be further configured in accordance with one or more embodiments described herein.

An automated qualification method for wafer probing in accordance with various embodiments may include: measuring probe-pad contact forces for a plurality of probe overdrive positions; statistically analyzing the measured probe-pad contact forces so as to determine parameter boundaries for a wafer probing process. The method may be further configured in accordance with one or more embodiments described herein.

A method for probe-force investigation in accordance with various embodiments may include: performing a plurality of probe-pad contacting processes; measuring probe-pad contact forces for a plurality of probe overdrive positions applied during the plurality of probe-pad contact processes; analyzing a relationship between the measured probe-pad contact forces and the applied probe overdrive positions so as to obtain a first probe-pad parameter region, in which a pad is plastically deformed by a probe, and a second probe-pad parameter region, in which the probe may cause damage to a layer underneath the pad. The method may be further configured in accordance with one or more embodiments described herein.

Various embodiments may further provide an apparatus configured to carry out a method according to any one of the embodiments described herein.

A probing apparatus in accordance with various embodiments may include: a measuring device for measuring a contact force between at least one probe and at least one contact pad for a plurality of probe overdrive positions; a determining device for determining a relationship between contact force and probe overdrive position from the measured contact forces; a determining device for determining a first region in the relationship exhibiting a non-linear dependence of the contact force from the probe overdrive position, and a second region exhibiting a linear dependence of the contact force from the probe overdrive position; and a determining device for determining a process window for a pad probing process based on the determined first region and second region.

In one or more embodiments, the measuring device may include: a probe card including at least one probe; a holding member for holding at least one wafer; and a moving member for at least one of moving the holding member towards the probe card or moving the probe card towards the holding member.

A computer program product in accordance with various embodiments includes instructions for performing a method according to any one of the embodiments described herein when said product is run on a computer (or processing device).

A non-transitory computer readable medium in accordance with various embodiments stores instructions for performing a method according to any one of the embodiments described herein. In accordance with one or more embodiments, the computer readable medium may be any type of storage medium suitable for nonvolatile storage of data or information, which may be known as such in the art, such as an optical storage medium (e.g., CD, DVD, HD DVD, Blue Ray disc, Laser Dic, or the like), a magnetic storage medium (e.g., Floppy Disk, Hard Disk Drive, Magnetic Tape, or the like), a magneto-optical storage medium (e.g., Mini Disc, Magneto-Optical (MO) disk, or the like), a semiconductor storage medium (e.g., ROM, Flash memory, PROM, EPROM, EEPROM, NVRAM, or the like), a USB storage medium, a Solid-State-Drive (SSD) storage medium, an MRAM storage medium, a PCRAM storage medium, a CBRAM storage medium, to name just a few examples.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method, comprising:
    measuring a contact force between at least one probe and at least one contact pad for a plurality of probe overdrive positions, and determining a relationship between contact force and probe overdrive position from the measured contact forces;
    determining a first region in the relationship exhibiting a non-linear dependence of the contact force from the probe overdrive position, and a second region exhibiting a linear dependence of the contact force from the probe overdrive position;
    determining a process window for a pad probing process based on the determined first region and second region; and
    carrying out the pad probing process using the determined process window.

2. The method of claim 1, wherein measuring a contact force between at least one probe and at least one contact pad comprises:
    measuring a contact force between a probe and a contact pad for a first probe overdrive position at a first lateral probe position at the contact pad; and
    measuring a contact force between the probe and the contact pad for a second probe overdrive position at a second lateral probe position at the contact pad.

3. The method of claim 1, wherein measuring a contact force between at least one probe and at least one contact pad comprises:
    measuring, in a first measurement, a contact force between a probe and a contact pad for a first plurality of probe overdrive positions ranging from a first minimum probe overdrive position to a first maximum probe overdrive position; and subsequently
    measuring, in a second measurement, a contact force between the probe and the contact pad for a second plurality of probe overdrive positions ranging from a second minimum probe overdrive position to a second maximum probe overdrive position.

4. The method of claim 3, wherein, in the second measurement, the probe is placed at a different lateral position at the pad than in the first measurement.

5. The method of claim 1, wherein measuring a contact force between at least one probe and at least one contact pad comprises:
    measuring a contact force between a first probe and a first contact pad for a first plurality of probe overdrive positions ranging from a first minimum probe overdrive position to a first maximum probe overdrive position; and
    measuring a contact force between a second probe and a second contact pad for a second plurality of probe overdrive positions ranging from a second minimum probe overdrive position to a second maximum probe overdrive position.

6. The method of claim 1, wherein measuring a contact force between at least one probe and at least one contact pad comprises measuring a contact force between at least one probe and a plurality of contact pads so as to obtain a plurality of measurement values for each of the probe overdrive positions, and averaging the plurality of measurement values for each of the probe overdrive positions.

7. The method of claim 1, wherein measuring a contact force between at least one probe and at least one contact pad comprises providing a randomized measurement setup, in which contact forces for a plurality of probe overdrive positions are measured at a respective plurality of contact pads.

8. The method of claim 1, wherein the at least one probe comprises a cantilever probe.

9. The method of claim 1, wherein the at least one probe comprises a probe card comprising a single probe.

10. The method of claim 1, wherein the at least one probe comprises a probe card comprising a plurality of probes.

11. The method of claim 1, wherein measuring a contact force between at least one probe and at least one contact pad comprises measuring a normal force between the at least one probe and the at least one contact pad.

12. The method of claim 1, further comprising measuring a contact resistance between the at least one probe and the at least one contact pad for each position of the plurality of probe overdrive positions.

13. The method of claim 1, wherein measuring a contact force between the at least one probe and the at least one contact pad comprises:
- bringing the at least one probe and the at least one contact pad in contact with one another; and subsequently
- at least one of moving the at least one contact pad towards the at least one probe or moving the at least one probe towards the at least contact pad.

14. The method of claim 1, wherein determining the first region and second region comprises performing a curve fitting process.

15. The method of claim 14, wherein the curve fitting process comprises performing a linear fit.

16. The method of claim 14, wherein the curve fitting process comprises performing a residual analysis.

17. The method of claim 1, wherein determining the first region and second region comprises determining a function representing the relationship between contact force and probe overdrive position, and determining a derivative of the function.

18. The method of claim 1, wherein the process window is defined in a parameter space comprising a number of probe-pad contacts and the probe overdrive position as parameters.

19. The method of claim 18, wherein the process window comprises at least one of a maximum probe overdrive position for a given number of probe-pad contacts and a maximum number of probe-pad contacts for a given probe overdrive position.

20. A method for probe-force investigation, comprising:
- performing a plurality of probe-pad contacting processes with a probing apparatus;
- measuring probe-pad contact forces for a plurality of probe overdrive positions applied during the plurality of probe-pad contacting processes;
- analyzing a relationship between the measured probe-pad contact forces and the applied probe overdrive positions to determine a first probe-pad parameter region, in which a pad is plastically deformed by a probe, and a second probe-pad parameter region, in which the probe may cause damage to a layer underneath the pad;
- calibrating the probing apparatus with a process window based on the first probe-pad parameter region and the second probe-pad parameter region; and
- controlling the probing apparatus to perform a pad probing process according to the process window to reduce damage to the layer underneath the pad.

21. A probing apparatus, comprising:
- a measuring device configured to measure a contact force between at least one probe and at least one contact pad of a semiconductor device for a plurality of probe overdrive positions;
- a determining device configured to determine a relationship between contact force and probe overdrive position from the measured contact forces;
- a determining device configured to determine a first region in the relationship exhibiting a non-linear dependence of the contact force from the probe overdrive position, and a second region exhibiting a linear dependence of the contact force from the probe overdrive position;
- a determining device configured to determine a process window for a pad probing process based on the determined first region and second region; and
- one or more processors configured to control the probing apparatus to perform the pad probing process using the process window to reduce damage to the semiconductor device.

22. The apparatus of claim 21, wherein the measuring device comprises:
- a probe card comprising at least one probe;
- a holding member for holding at least one wafer;
- a moving member for at least one of moving the holding member towards the probe card or moving the probe card towards the holding member.

23. A non-transitory computer readable medium, storing instructions for performing a method, the method comprising:
- measuring a contact force between at least one probe and at least one contact pad for a plurality of probe overdrive positions, and determining a relationship between contact force and probe overdrive position from the measured contact forces;
- determining a first region in the relationship exhibiting a non-linear dependence of the contact force from the probe overdrive position, and a second region exhibiting a linear dependence of the contact force from the probe overdrive position;
- determining a process window for a pad probing process based on the determined first region and second region; and
- controlling the pad probing process using the process window.

* * * * *